United States Patent
Buller et al.

(10) Patent No.: US 7,476,880 B2
(45) Date of Patent: Jan. 13, 2009

(54) WRITING A CIRCUIT DESIGN PATTERN WITH SHAPED PARTICLE BEAM FLASHES

(75) Inventors: Benyamin Buller, Cupertino, CA (US); Richard L. Lozes, Pleasanton, CA (US); Robert M. Sills, Castro Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 203 days.

(21) Appl. No.: 11/243,299

(22) Filed: Oct. 3, 2005

(65) Prior Publication Data

US 2007/0085032 A1    Apr. 19, 2007

(51) Int. Cl.
G21K 5/10 (2006.01)
H01J 37/08 (2006.01)

(52) U.S. Cl. .............. 250/492.22; 250/492.2; 250/492.23; 430/296; 430/942; 716/8; 716/11; 716/19; 716/21

(58) Field of Classification Search ........... 250/492.2, 250/492.22, 492.23; 430/296, 942; 716/8, 716/11, 19, 21
See application file for complete search history.

(56) References Cited

U.S. PATENT DOCUMENTS

| | | |
|---|---|---|
| 3,894,271 A | 7/1975 | Pfeiffer et al. |
| 4,243,866 A | 1/1981 | Pfeiffer et al. |
| 4,525,629 A | 6/1985 | Morita et al. |
| 4,544,845 A | 10/1985 | Michel |
| 4,963,748 A | 10/1990 | Szilagyi |
| 5,251,140 A | 10/1993 | Chung et al. |
| 5,334,282 A | 8/1994 | Nakayama et al. |
| 5,876,902 A | 3/1999 | Veneklasen et al. |
| 6,259,106 B1 | 7/2001 | Boegli et al. |

(Continued)

FOREIGN PATENT DOCUMENTS

JP    58153329 A    9/1983

(Continued)

OTHER PUBLICATIONS

Takemura et al.; "ADvanecd E-Beam Lithography System . . ." 19th Annual BACUS Symposium on Photomask Technology, Monterey California Sep. 1999 SPIE vol. 3873 277-786X/99/$10.

(Continued)

*Primary Examiner*—Jack I. Berman
*Assistant Examiner*—Meenakshi S Sahu
(74) *Attorney, Agent, or Firm*—Ashok K. Janah

(57) ABSTRACT

A shaped particle beam writing strategy can be used to write a pattern with a particle beam onto a substrate. The pattern comprises a circuit design that is fractured into a plurality of arbitrary polygons. The writing strategy comprises transforming and fracturing the arbitrary polygons into a plurality of restricted polygons, each restricted polygon being represented by a location coordinate, at least two dimension coordinates, and at least one external edge indicator. Thereafter, the restricted polygons are tiled into a set of tiles comprising interior tiles and external edge tiles. Flash data is assigned for each tile such that the interior tiles are assigned a first flash area and the external edge tiles are assigned a second flash area that is smaller than the first flash area. The flash data is arranged in a selected order to write the pattern with a modulated particle beam, such as an electron beam, on a substrate.

16 Claims, 13 Drawing Sheets

U.S. PATENT DOCUMENTS

| | | | |
|---|---|---|---|
| 6,262,429 | B1* | 7/2001 | Rishton et al. ......... 250/492.23 |
| 6,753,540 | B2 | 6/2004 | Wakimoto |
| 7,055,127 | B2* | 5/2006 | Pierrat et al. .................. 716/19 |
| 2004/0179366 | A1 | 9/2004 | Ando et al. |

OTHER PUBLICATIONS

Dick et al.; "Parallel and Hierarchical postprocessing . . . " J. Vac. Sci. Technol. B 16(6), Nov./Dec. 1998.

Nakagawa et al.; "Development of a Next Generation . . . " JEOL Ltd. Semiconductor Equipment Division 1-2-3Chome, Musashino, Akishima, Tonyo 196-8558, Japan.

H.C. Pfeifer; "Variable spot shaping for electron-beam lithography" J Vac. Sci Technol., 15(3), May/Jun. 1978. pp. 887-890 (IBM).

Y. Sodha et al; "Recent progress in cell-projection electron-beam lithography" Microelectronic Engineering 67-68 (2003) pp. 78-86 (Hitachi).

K. Nakamura et al; "Advanced electron beam lithography system for sub-half-micron ultra-large-scale production . . . " JVST B8, (6), Nov./Dec. 1990, pp. 1903-1908; (JEOL).

M. Fujinami et al; "EB60: An advanced direct wafer exposure electron-beam lithography system . . . " J. Vac. Sci. Technol. B5 (1), 1987, pp. 61-65.

T. Watanabe et al; "Reliability enhancements for the direct wafer exposure electron beam system EB60" J. Vac. Sci. Technol. B9 (6), 1991, pp. 3028-3032.

T. Hosokawa et al; "Electron beam optical system with large field coverage for submicron lithography" J. Vac. Sci Technol. B1 (4), 1983, pp. 1293-1297.

Nakagawa et al; "Development of a Next Generation E-Beam Lithography System" SPIE 3546 (1998) 45-54.

Komagata et al; "Development of electron beam optical column for mask lithography system" SPIE 3096 (1997) 125-136.

* cited by examiner

WRITING A CIRCUIT DESIGN PATTERN WITH SHAPED PARTICLE BEAM FLASHES

BACKGROUND

Embodiments of the present invention relate to generating and writing a circuit design pattern on a substrate with a shaped particle beam.

Pattern generators are used to write patterns on substrates, such as masks for semiconductor fabrication, semiconductor wafers, displays and circuit boards, magnetic bubble fabrication, and optical data storage media fabrication. For example, patterned lithographic masks are used to fabricate integrated circuits, printed circuits (PCB), displays, and other patterned boards. The lithographic mask is made up of a plurality of pattern elements formed on a radiation permeable plate. The patterned elements are used to transfer a circuit design pattern into a substrate, such as a semiconductor wafer or dielectric. A typical process for fabricating a lithographic mask includes, for example, (i) forming a layer of a metal-containing material on a radiation permeable plate, (ii) forming a resist layer on the metal-containing layer to create a blank lithographic mask, the resist layer being sensitive to a particle beam such as an electron or ion beam, (iii) writing a pattern on the mask by selectively exposing the blank lithographic mask to the modulated particle beam, (iv) developing the exposed material to reveal a pattern of features, (v) etching the revealed portions of the metal-containing material between the resist features to transfer the pattern captured in the resist features into the metal-containing material, and (vi) stripping residual resist from the lithographic mask.

The pattern is written by selectively exposing an energy sensitive resist layer on the substrate to a particle beam. During writing, the particle beam is broken into discrete units, commonly referred to as flashes, which form a portion of the pattern that is exposed on the substrate during an exposure cycle. While the particle beam is modulated to form flashes and deflected across small dimensions, the substrate is moved in a plane by a substrate support, causing the modulated particle beam to write the pattern on the substrate. A particle beam such as an electron beam can be formed in a electron beam column having discrete components that focus, blank and deflect electrons generated from a source to write an electron pattern on a substrate, exemplary columns being in, for example, U.S. Pat. No. 6,262,429 to Rishton et al.; U.S. Pat. No. 5,876,902 to Veneklasen et al.; U.S. Pat. No. 3,900,737 to Collier et al. and U.S. Pat. No. 4,243,866 to Pfeiffer et al.; all of which are incorporated herein by reference in their entireties.

The modulated particle beam is moved and flashed across the substrate using a scanning system, such as for example, raster, vector, or hybrid raster-vector scanning. The beam and substrate are moved relative to one another so that the beam traverses across the substrate in linear strip-wise motion (e.g. raster beam scanning), in vector based steps (vector scanning), or in a combination of vector and raster scanning. For example, in one raster scan method, called raster Gaussian beam scanning (RGB), a particle beam is scanned in successive parallel lines to cover all the pixel cells of a pixel grid across the substrate. The circuit design pattern is retrieved and sampled to create a gray pixel map from which geometric shapes in the form of particle beam flashes are constructed. The substrate is exposed to the flashes one pixel site at a time along the scan trajectory by moving the substrate along a plane perpendicular to the direction of the particle beam while the beam is flashed by blanking. In this process, the flash area is roughly the size of the address unit of the pixel grid. Because the flashes have a roughly Gaussian profile adjacent flashes blend smoothly together. RGB has the advantages of good pattern resolution and predictable writing speed. However, the Gaussian flash profile limits feature resolution and critical dimension (CD) uniformity. RGB resolution can be improved by reducing the basic address unit but this quadratically lengthens writing time. Overlapping flashes and gray modulation can be used to achieve finer edge placement, but fundamental limitations of feature resolution and CD uniformity are still a problem for fine features.

In a vector scan method, called vector shaped beam (VSB) scanning, a particle beam with a variable shaped beam is moved across the substrate directly to locations specified by vector coordinates and then flashed once over those locations. The circuit design pattern is divided into a series of rectangles and parallelograms, and the particle beam is then controlled to move directly to only those pixel cells that require exposure and then flashed to expose the pixel site with the desired shaped beam. The beam is controlled to have different flash shapes and sizes which can expose multiple pixel cells at the same time. Thus, the original pattern is translated to a vectorized representation having a list of pixel locations and corresponding beam flash shapes and areas. The flash area is independent of the addressing of the vector and the flash profile for a given flash area is much steeper, that is it has sharp edges at which the energy sharply dissipates in intensity, than the edges of a Gaussian beam which gradually dissipate in a Gaussian curve. This provides better resolution. Also, in VSB, the beam traverses directly to the area to be written while unexposed areas are skipped allowing the total exposure time to be reduced by the percentage of unwritten area. While VSB improves feature resolution and critical dimension uniformity, it has relatively slow flash rates because of the high precision digital to analog converters (DAC) required for vectoring the beam.

In one hybrid raster-vector scan method, commonly known as raster shaped beam (RSB) scanning, a shaped particle beam that can provide flashes having different shapes and sizes, is line scanned across the substrate. As with VSB, the flash profile is steep, that is it has sharp edges, yielding good resolution and CD uniformity; and as with RGB, the rasterized scan yields good placement accuracy. Furthermore, the flash rate can be much higher than that employed in VSB, because only low resolution DACs are required. However, RSB unfortunately retains the disadvantage of RGB in that further improvements to feature resolution quadratically lengthen printing time because each flash must be contained within a pixel grid cell.

In order to write newer circuit design patterns having features with increasingly smaller dimensions, it is desirable to have a writing method and strategy which provides high pattern resolution coupled with faster writing speeds. Higher resolution is needed because newer circuit designs have features with dimensions on the order of less than 50 nm which is more 2½ smaller than conventional feature sizes of over 130 nm. Vectorized scanning methods provide faster writing speeds by maximizing the flash area which is the area covered by a single flash. However, larger flash areas, of for example electron beams, can lead to larger electron blur because of the electron to electron interactions within each flash that arise from the higher beam current carried by the larger flash. This results in poor definition of the edge of the flashed area resulting in lower pattern resolution.

Thus it is desirable to have a pattern generator and writing method that provides higher resolution for circuit designs with finer dimensions. It is further desirable to have a writing system that can write a particle beam with improved resolution without sacrificing writing speed. It is also desirable to have a writing strategy that may be implemented using many different scanning systems.

SUMMARY

A shaped particle beam writing strategy can be used to write a pattern with a particle beam onto a substrate. The pattern comprises a circuit design that is fractured into a plurality of arbitrary polygons. The writing strategy comprises transforming and fracturing the arbitrary polygons into a plurality of restricted polygons, each restricted polygon being represented by a location coordinate, at least two dimension coordinates, and at least one external edge indicator. Thereafter, the restricted polygons are tiled into interior tiles and external edge tiles. A flash area is assigned to each tile such that the interior tiles are assigned a first flash area and the external edge tiles are assigned a second flash area that is smaller than the first flash area. The flashes are then arranged in a selected order to write the pattern with a particle beam onto a substrate.

A writing strategy for writing a circuit design pattern with an electron beam onto a substrate, comprises reading a circuit design pattern comprising a set of geometric primitives composed of arbitrary polygons; fracturing the arbitrary polygons into a plurality of restricted polygons, each restricted polygon being represented by a location coordinate, at least two dimension coordinates, and at least one external edge indicator; tiling the restricted polygons into a set of tiles comprising interior tiles and external edge tiles; assigning an electron beam flash area to each tile, the electron beam flash comprising a first flash area for an interior tile and a second flash area for an external edge tile, the second flash area being smaller than the first flash area; arranging the electron beam flashes in a selected order; and moving an electron beam across a substrate and modulating the electron beam to flash the beam in the selected order to write the circuit design pattern onto the substrate.

A processor for writing a pattern with an electron beam onto a substrate, the pattern comprising a plurality of arbitrary polygons, and the processor comprising:

(a) polygon fracturing program code to fracture the arbitrary polygons into a plurality of restricted polygons that are each represented by a location coordinate, at least two dimension coordinates, and at least one external edge indicator;

(b) tiling program code to tile the restricted polygons into a set of tiles comprising interior tiles and external edge tiles;

(c) flash assignment program code to assign an electron beam flash to each tile, the electron beam flash comprising a first flash area for an interior tile and a second flash area for an external edge tile, the second flash area being smaller than the first flash area;

(d) flash ordering program code to arrange the flashes in a selected order; and (e) electron beam column program code to modulate an electron beam to flash the beam in the selected order of flashes while moving a substrate upon which the electron beam is incident to write the pattern onto the substrate.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1A:
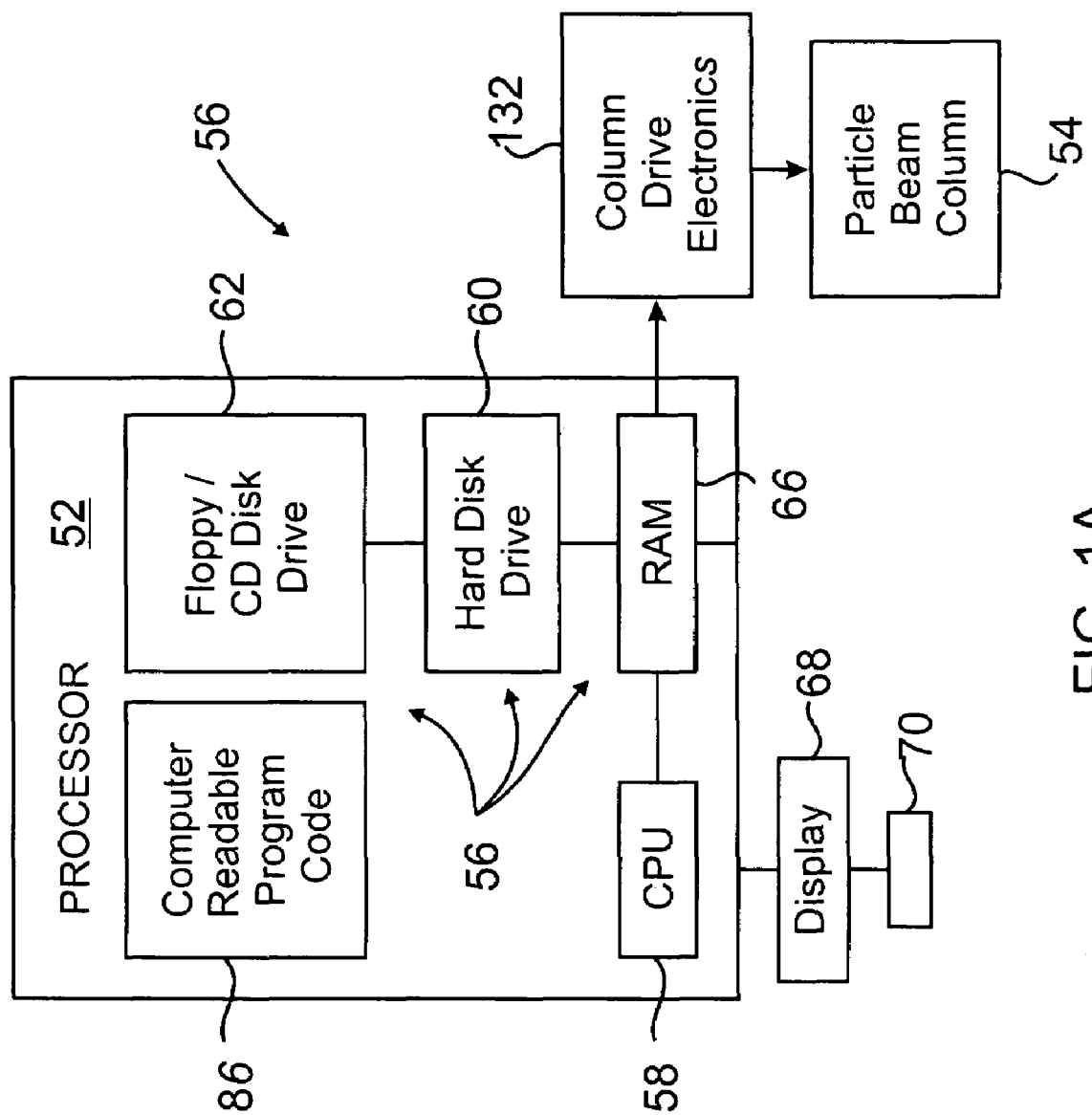
FIG. 1A is a schematic block diagram of a processor capable of processing a circuit design pattern to generate flash data for a particle beam column.

A particle beam apparatus 50 uses a shaped particle beam in a writing strategy useful for writing a circuit design pattern onto a substrate. The apparatus 50 can provide a shaped particle beam that is, for example, an electron or ion beam that can be shaped to provide different geometric flash shapes. The apparatus 50 comprises a processor 52 to process circuit pattern data and column drive electronics 132 to control a particle beam column 54, as for example, shown in FIG. 1A. The particle beam column 54 can provide a single beam or a set of particle beams which are organized to provide a brush of beams. An exemplary particle beam apparatus capable of performing this writing strategy that uses electron beams is described in, for example, U.S. patent application Ser. No. 11/243,363, entitled "Electron Beam Column for Writing Shaped Electron Beams", to Lozes et al., which was filed on Oct. 3, 2005, and which is incorporated herein by reference in its entirety. However, the present writing strategy can be used in other types of apparatus 50, such as ion beam apparatus, and thus, the scope of the claims should not be limited to an electron beam apparatus.

The circuit design pattern is a circuit design layout to be written with the particle beam onto a substrate such as a mask, semiconductor wafer, display panel or other substrate. The circuit design pattern can be generated by, for example, a conventional circuit design program such as the Design for Manufacturing Product Family available from Synopsys Inc.; or the Design to Silicon Platform available from Mentor Graphics Corp.; or Encounter Digital IC Design Platform from Cadence Design Systems, Inc.. Conventional circuit designs include circuit layouts, for example, interconnect lines, contact holes, spacers, and other elements of the circuitry of a semiconductor based integrated circuit chip or display. The circuit design pattern expresses the circuit design layout in the form of geometric primitives comprising a sequence of arbitrary polygons with shape and location information, which is output as a pattern data map structured for writing efficiency. The arbitrary polygons are polygonal shapes which can be combinations of conventional polygons, for example, combinations of adjacent rectangles and/or triangles. The pattern data map of arbitrary polygons is initially prepared offline from the particle beam column 54 and stored on the memory 56 of a processor 52, such as a RAID disc drive.

To write the circuit design pattern onto a substrate, the processor 52 reads at least a portion of the prepared circuit design pattern from the memory 56, the size of the read data dependent upon its buffer memory size, and processes the read data for writing. The processor 52 comprises electronic hardware and circuitry comprising integrated circuits suitable for processing data to send data signals to the column drive electronics 132, which in turn, have electronic components to operate the particle beam column 54 and its peripheral components. For example, the column drive electronics 132 can send signals to, and receive signals from, a particle beam column 54 to modulate a particle beam to flash the beam in the selected order of flashes while moving a substrate upon which the beam is incident to write the pattern onto the substrate. While the processor 52 and column drive electronics 132 are described as separate units, they can also be combined into one unit, or broken into further units as would be apparent to one of ordinary skill in the art. The processor 52 is adapted to receive and accept data, run algorithms, produce output data and signals, detect data signals from the detectors and other chamber components, and to monitor or control a particle beam apparatus. For example, the processor 52 may comprise a computer comprising (i) a central processing unit (CPU) 58, such as for example a conventional microprocessor from INTEL Corporation, (ii) a memory 56 that includes a non-removable storage medium 60, such as for example, a hard drive such as a RAID drive, ROM, RAM, and a removable storage medium 62, such as for example a CD or floppy drive; (iii) application specific integrated circuits (ASICs) that are designed and preprogrammed for particular tasks, such as retrieval of data, data processing, and operation of particular components of the particle beam apparatus; and (iv) various interface boards that are used in specific signal processing tasks, comprising, for example, analog and digital input and output boards, communication interface boards, and motor controller boards. The interface boards, may for example, process a signal from a process monitor and provide a data signal to the CPU. The computer also has support circuitry that include for example, co-processors, clock circuits, cache, power supplies and other well known components that are in communication with the CPU. RAM 66 can be used to store the software implementation of the present invention during process implementation. The instruction sets of code of the present invention are typically stored in storage mediums and recalled for temporary storage in RAM when being executed by the CPU. The user interface between an operator and the controller can be, for example, via a display 68 and a data input device 70, such as a keyboard or light pen. To select a particular screen or function, the operator enters the selection using the data input device and can reviews the selection on the display.

The processor 52 also comprises computer program code 80 that is readable by the computer and may be stored in the memory, for example on the non-removable storage medium or on the removable storage medium. The computer program code 80 comprises one or more software programs and/or sets of instructions of program code to transform the circuit design pattern to flashes, assign the flashes to scans, and operate the particle beam column 54 and its components to scan a particle beam across a substrate 150. The computer program code 80 may be written in any conventional programming language, such as for example, assembly language, C++, Pascal, or Fortran. Suitable program code is entered into a single file, or multiple files, using a conventional text editor and stored or embodied in computer-usable medium of the memory. If the entered code text is in a high level language, the code is compiled, and the resultant compiler code is then linked with an object code of pre-compiled library routines. To execute the linked, compiled object code, the user invokes the object code, causing the CPU to read and execute the code to perform the tasks identified in the program.

The processor 52 reads a portion of the circuit design pattern and transforms the read data to geometric shapes, tiles, and timed flash data as for example shown by the exemplary data flow diagram of FIG. 1. The circuit design pattern is transformed to geometric shapes which can be more easily converted to tiles and then to particle beam flashes which are used to modulate a particle beam column to write onto a substrate. In the first step, a section of the stored circuit design pattern with arbitrary polygons is read by polygon fracturing program code which fractures the arbitrary polygons into restricted polygon shapes. The polygon fracturing program code can include, for example, a CATS program available from Synopsys Inc., or the Calibre MDP program from Mentor Graphics Corp.

Figure 2A:
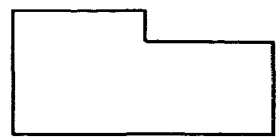
FIGS. 2A to 2D are diagrams showing three different ways to fracture an arbitrary polygon into restricted polygons which are rectangles.
Figure 2B:
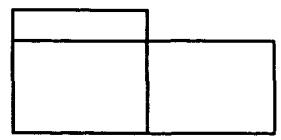
Figure 2C:
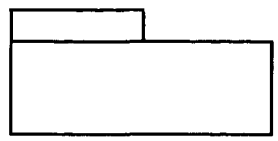
Figure 2D:
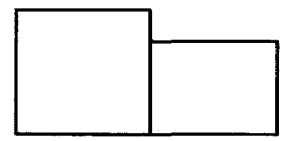

The restricted polygons have predefined restricted shapes, such as axis-parallel rectangles, trapezoids, or right triangles. The restricted polygon shapes are those shapes which are easy to subsequently fracture into tiles and eventually, particle beam flash data. Exemplary ways of fracturing an arbitrary polygon into restricted polygons which are rectangular in shape are shown in FIGS. 2A-2D. The arbitrary polygon of FIG. 2A can be fractured so that every edge is cleanly an internal or an external edge. FIG. 2B shows a fracturing in which three rectangles are created with a small sliver rectangle on top. The sliver rectangle is difficult to flash because of its small size. The fracturing shown in FIG. 2C also creates the undesirable sliver; while the fracturing shown in FIG. 2D breaks the shape into fewer, two rectangles, without forming the sliver rectangles. Fixing the sliver problem, however, created an ambiguous edge, namely, the left rectangle's right edge, which is partly interior and partly exterior to the pattern. Also note the example of FIG. 2D, in which the right rectangle has three external edges, the rectangle cannot be written with three edges formed by the lower aperture. If the rectangle is large enough, however, it can be tiled into smaller flashes as explained below to allow advantageously using the lower aperture for all exterior edges. The example of FIG. 2D is preferred. Flashes of small dimension (slivers) are difficult to calibrate, and therefore lead to loss of critical dimension control.

Each restricted polygon shape is represented by a location coordinate, at least two dimension coordinates, and at least one edge indicator. The location and dimension coordinates comprise 32 bits for each coordinate; however, they may also comprise more or fewer bits, for example, 64 bits. The location coordinates typically identify an origin of the restricted polygon, for example, a selected corner such as the lower left corner. The dimension coordinates are, for example, the length and width of a rectangle or the base and height of a triangle.

In addition, the restricted polygons are also marked with edge indicators. Marking the edges of figures allows determination, in subsequent steps, as to whether a particular restricted polygon tile falls on the edge, interior or an ambiguous location of the polygonal figure. Note that the edge indicator can be an internal edge or an external edge indicator, of which, the external edge indicator is more important because it is used to determine the outside boundary of the polygonal figure. Thus, the edges of the polygonal figures can also be marked to with only a location coordinate, dimension coordinates, and at least one external edge indicator which is either on to indicate an external edge or off to indicate an interior location or internal edge.

The edge indicator information can be provided by attaching an 8-bit tag to the identification information for each polygonal figure. The 8-bit tag uses 2 bits per side to specify whether it is an internal edge, external edge, or ambiguous. While 8 bits may not be necessary, since eventually only 16 types of rectangles are choices, it simplifies the program code.

Another method of providing external edge identifiers is by assuming that all the edges of the restricted polygons are external edges, and that interior figures or internal edges arise only from the tiling of the restricted polygons into flash tiles. While this is not an optimal solution because it increases the number of flashes, as will be apparent from the subsequent discussion, it provides a relatively easy way to deal with a difficult problem.

The restricted polygon data is then transformed into tiles and then into flashes suitable for scanning across the substrate. In this step, program code on the processor 52 performs the functions of (a) receiving restricted polygon data and downloading the data into a figure memory, (b) processing control commands that allow processing the restricted polygon data, (c) accepting commands initiating rasterization for a raster scan pass and signaling back when the rasterization pass is done, (d) converting the restricted polygons into particle beam flashes, (e) arranging the flashes in a selected order, by for example, assigning the flashes to raster locations or returning an error code if this process fails, and (f) sending the flash data and the flash location assignment data to the flash generator with suitable data flow controls.

In the first step, the processor program code receives a data set corresponding to the restricted polygon figures, each polygon being identified by its location coordinates, dimension coordinates and edge identifier. Tiling program code are sets of instructions that operate a tiling algorithm to decompose each restricted polygon into separate tiles, as shown by the box labeled "Tile", that each will be subsequently written on the substrate by an individual particle beam flash having a particular shape and size. Tiles are simple geometric shapes, corresponding to particle beam flashes, and that fit into a restricted polygon shape to completely define the shape using flashes. The tiling operation is performed using a tiling algorithm and the flash shape and size constraints of the particle beam apparatus. The tiling program code retrieves the restricted polygon data from memory and passes the data through the tiling algorithm which fractures the restricted polygons into flash tiles using the flash sizing constraints. In forming the tiles, the tiling program code has to choose between different flash shapes and sizes that may be available to select a suitable set of tiles for a particular restricted polygon shape. The shape of each flash may be restricted by the type and orientation of the apertures of the particle beam apparatus. In one example, the tiles shapes are limited to rectangles or right isosceles triangles (45-degree triangle); however, other defined shapes can also be used instead of these shapes, such as trapezoids. The tiles are oriented with two or more edges parallel to the axes, and tile coordinates are defined as pairs over finite subsets of the non-negative integers.

Figure 3A:
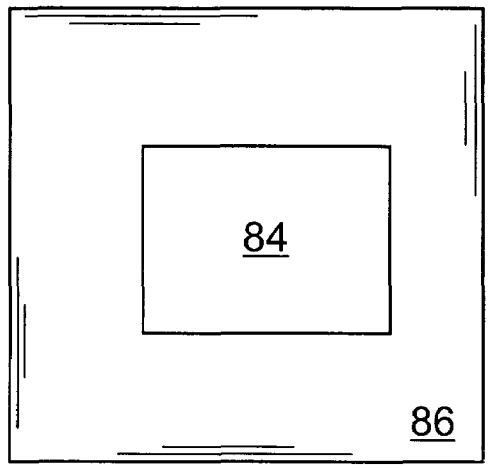
FIGS. 3A and 3B are schematic diagrams of upper and lower aperture plates that can be used to shape a particle beam into rectangles and right isosceles triangles.
Figure 3B:
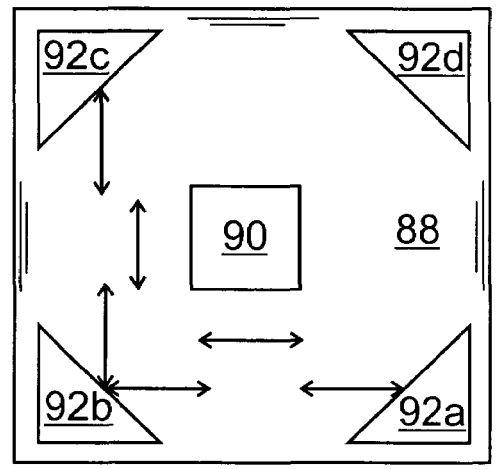

In the particle beam apparatus, the shape of the flashes is obtained by imaging a square upper aperture 84 of a first aperture plate 86 as shown in FIG. 3A, onto a second lower aperture plate 88 that contains five apertures, a square aperture 90 surrounded by four right triangle apertures 92$a$-$d$ as shown in FIG. 3B. This allows the formation of shapes such as a rectangle, with sides parallel to the X/Y axes by projecting the image of the upper square aperture 84 against one of the corners of the lower square aperture 90, so two adjacent edges are formed by the lower aperture. Four different types of rectangles can be formed with the four corners as shown by the rectangles 1-4 of FIG. 4. Right-angle (45-degree) triangles can also be formed with their non-hypotenuse sides parallel to the X/Y axes, the hypotenuse being formed by the lower aperture, as shown by the triangles 5-8 in FIG. 4.

The flash areas of the tiles are also constrained by the parameters of the particle beam apparatus. In one dimension, the tiles are sized so that a maximum singular dimension of a tile is less than $3/2\lambda$, where $\lambda$ is a fixed unit of length for the particle beam apparatus which is related to the maximum flash area and the separation between raster locations. For an electron beam apparatus, $\lambda$ is a characteristic dimension of the electron beam. In one version, $\lambda$ is from 50 to about 200 nm and is expressed in the base address unit of the system, for example, the base address units can be ¼ nm. For an electron beam column having a maximum flash area of 192 nm and a separation distance between raster locations in the X-direction of about 1024 nm, the value of $\lambda$ is about 128 nm. This maximum size constraint derives from the optics of the particle beam apparatus. In one singular dimension, the size of a tile should also be a positive value, i.e., a non-zero value. For better results, the minimum singular dimension should be at least about ½$\lambda$.

Figure 4:
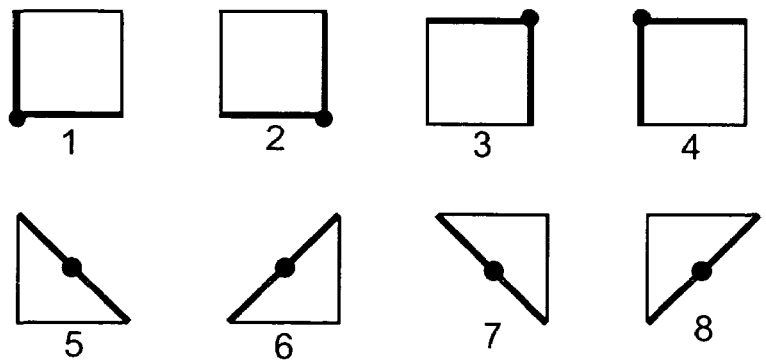
FIG. 4 is a schematic diagram showing the different flash shapes that can be obtained from the apertures of FIGS. 3A and 3B, and also showing the edges of the lower aperture superimposed on the flash shapes.

Referring back to FIG. 3B, each arrow represents a length of $1.5\lambda'$, where $\lambda'$ is defined as a number slightly greater than $\lambda$, for example, greater than $\lambda$ by about 10%. FIG. 4 shows the 8 shape types produced by these apertures, and the heavy lines show the edges of these shapes, formed by the apertures 90, 92$a$-$d$ of the lower aperture plate 88. The circular dots are reference points which represent locations that are fixed relative to the center of the lower aperture plate 88. A selected shape type and size is formed by imaging the upper aperture square 84 in the right location over the lower aperture plate 88 and placing the flash in the proper location relative to the raster location in the scan by microvectoring.

The tiling program code uses the edge indicators created in the earlier stage to determine whether a particular tile falls on the edge, interior or an ambiguous location of the figure. Thus a restricted polygon can be fractured to form a set of tiles comprising one or both of interior tiles and external edge tiles. The edge tiles are located along the external perimeters or edges of the polygonal figure, and are differentiated from the interior tiles that are used fill the interior of the figure with interior flash areas, and the internal edge tiles which can be treated the same as interior tiles.

The flash assignment program code assigns an electron beam flash to each tile. In one aspect of the present invention, the flashes assigned to the tiles, include a first flash area which is assigned to interior tiles and a second flash area which is assigned to external edge tiles. The second flash area is smaller than the first flash area. For example, the second flash area is less than about ¾ the first flash area, for example, about ½ the first flash area. In one version, the second flash area is less than or equal to about $\lambda^2$ and the first flash area is less than or equal to about $2\lambda^2$. In this version, the dimension of the first or second flash area is less than or equal to about $3/2\lambda$. The two-dimensional size constraint on the edge tiles of an area that is less than about $\lambda^2$ area reduces beam blurring effects which occur from interactions of the energy transmitted in the beam, for example, inter-electron interaction at high electron beam currents. Beam blurring tends to reduce the definition of the edges of the printed figure. However, the beam blur of interior flash areas does not affect edge definition since surrounding flash areas cover up edges of the interior flash area. Thus, the interior tiles which are positioned at the interior of the figure are sized to have larger areas which are less than $2\lambda^2$. The tiling differentiation step serves to reduce the total number of flashes or flash count and consequently improve printing speed while maintaining good printing resolution. Triangular tiles have special constraints and these tiles are constructed so that they do not exceed $\lambda^2$ area by virtue of the linear constraints applied to the tiles.

After the flash shape and size constraints are assigned to each tile, the flash data generated by the processor 52 is now processed for writing on the substrate by a suitable writing method. The processor 52 comprises flash ordering program code to arrange the flashes in a selected order. The flashes are arranged in a selected order that is constrained by the type of scanning system used, for example, raster, vector or hybrid raster-vector scanning. In each case, the flash data is suitably modified to allow scanning with the scanning constraints of the selected raster, vector, or hybrid raster-vector scanning method.

In a preferred hybrid raster-vector scanning method, called raster microvector (RMV) shaped beam scanning, a particle beam with a controlled flash shape is flashed at different locations across a substrate by a vector minor field scan superimposed on a raster major field scan. In this method, each vector field is assigned at most one flash and the vector flash fields are overlapped along raster scans which are offset by set distances to locally average over variations in pattern density. This allows RMV scanning to provide predictable, fast, high-resolution printing regardless of pattern complexity. Pattern placement error in RMV is small, comparable to that obtained in conventional raster Gaussian beam scanning methods. Feature resolution and CD uniformity are also small, comparable to those of vector shaped beam or raster shaped beam scanning.

Figure 1B:
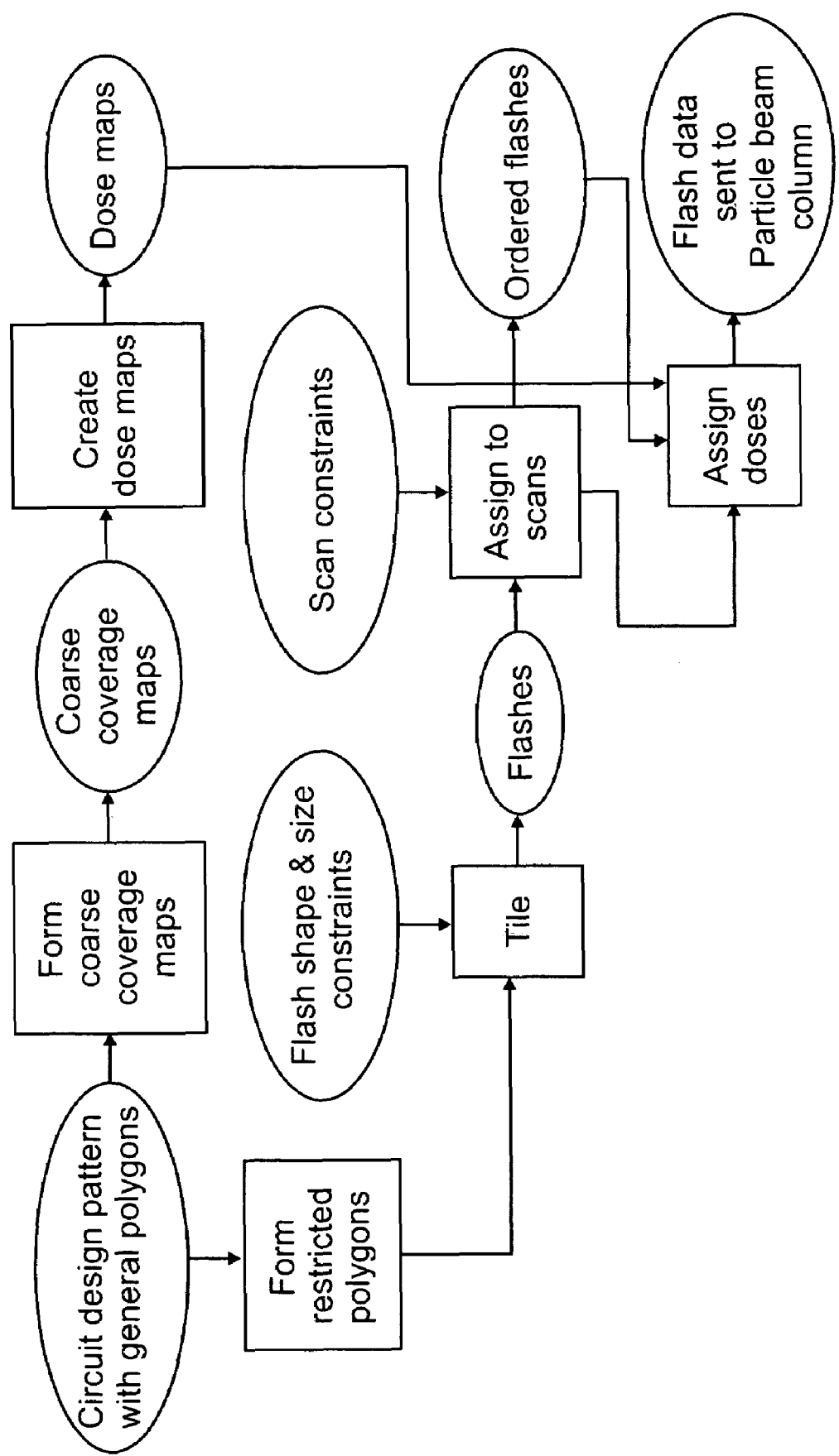
FIG. 1B is a schematic data flow diagram showing the processing of data from a circuit design pattern to flash data which can be written on a substrate with a particle beam—the boxes contain operations or processes and ovals contain objects.

When RMV scanning is used, the processor assigns each flash to a major raster scan field as shown by the box entitled "assign to scans" as shown in FIG. 1B. The major raster scan field assignment is restricted by scan constraints such as scan length (expressed in units of length such as microns), number of raster locations per scan, and scan width. The following operations are followed in assigning the flashes to particular major raster field scans. First, each flash is associated with one scan which is selected according to the flash location in the overall pattern and the flash origin.

Next, all the flashes of an individual scan are sorted into an order, which could be ascending or descending, for example, the flashes can be sorted in ascending order of the low end of the raster-location range. The sorted list is processed so that each flash is associated with the lowest raster location in its range that is not yet associated with another flash. If a flash is associated with a raster scan that lies outside the frame it is discarded. Thus, each flash is then assigned to one vector based location in the major raster scan field. Each raster scan consists of a series of equally spaced raster locations. If the algorithm fails on any flash because all raster locations in its range are already associated with other vector located flashes, processing stops and an error code is returned. This process is repeated for each raster scan within the frame.

After assigning the flashes in a selected order corresponding to raster scan locations, a dose is assigned to each flash. The flash dose is the dwell time that the particle beam is maintained turned on over a vector determined location along a raster major field scan. Thus, the final flash data includes flash shape, location and dose. The flash data can be communicated by (i) sending data for each flash, or (ii) by sending data for every raster location including unexposed locations. The second method of sending data for every raster location requires more packets of information but fewer bytes per packet so this method is preferred.

During scanning, the particle beam is modulated by blanking the beam while moving a substrate upon which the particle beam is incident. Scanning is performed by writing a series of passes, with each pass consisting of a series of Y-oriented scans. A multiphase writing strategy is typically used with the choice of 4-phase or 2-phase scans. In 4-phase writing, successive passes are stepped up in the Y-axis direction by roughly ¼ of the scan length for that each area is exposed to a total of four times. In 2-phase writing, successive passes are stepped up in the Y-axis direction by roughly ½ of the scan length so that each area is exposed twice.

Figure 5:
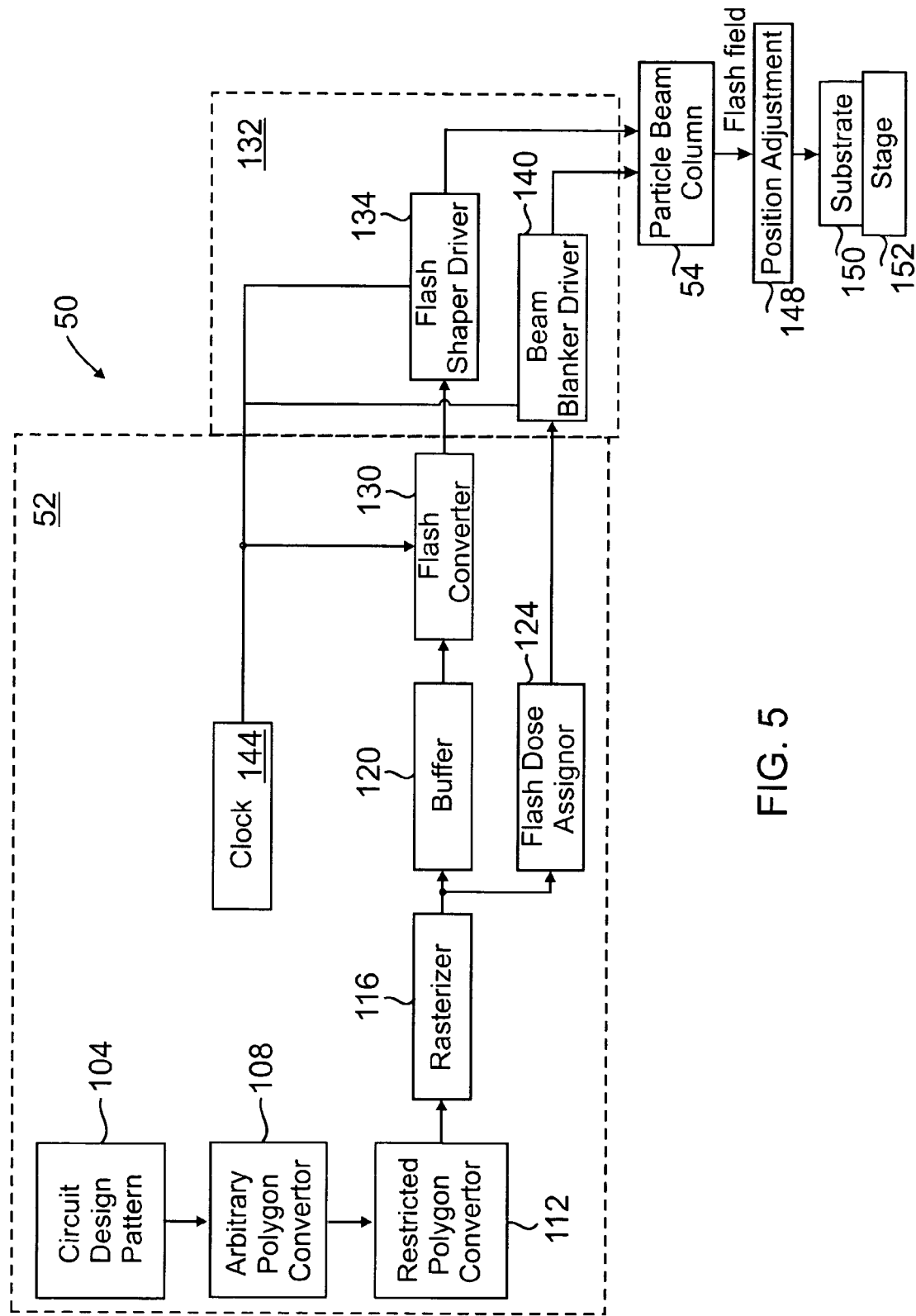
FIG. 5 is a schematic block diagram of a particle beam apparatus that includes a rasterizer, buffer circuit, flash dose assignor, beam blanker driver, flash converter, flash shaper drive, and a particle beam column.

FIG. 5 shows a simplified block diagram of a typical particle beam apparatus 50 capable of shaping and blanking the particle beam to write a pattern on a substrate with a raster microvectoring scan. While a particle beam column 54 that is an electron beam column is provided to illustrate an exemplary version of an apparatus capable of performing the writing strategy it should be understood that an ion beam column or other particle beam (e.g., laser) may be substituted. Prior to processing in the apparatus 50, the circuit design pattern 104 is retrieved by an arbitrary polygon converter 108 which converts the circuit design pattern to arbitrary polygons. A restricted polygon converter 112 then converts the arbitrary polygons to restricted polygons that are identified by location coordinates, at least two dimension coordinates, and at least one edge indicator. The converters 108, 112 comprise program code and/or hardware residing on the processor 52. The connecting lines of the processor 52 typically represent multi-line data busses.

The processor 52 comprises a rasterizer 116 which retrieves, and operates on, the restricted polygons with tiling program code comprising a tiling algorithm to create tiles which are identified as interior tiles or external edge tiles. The rasterizer 116 is part of the processor 52 that is capable of performing the described data transformation processes. Rasterizer 116 receives as an input signal in the form of restricted polygon data, a portion of the circuit design pattern data that is located in a fixed frame strip. The amount of circuit design pattern data that is received is limited by the size of the buffer 120. The rasterizer 116 converts the restricted polygons data to tiles. The rasterizer 116 can also process the data to create a coarse coverage map, which is a density map on a preselected scale that is created to handle corrections such as fogging and proximity effect correction.

The tile data is then passed from the rasterizer 116 to a buffer 120 and flash dose assignor 124 which assigns flash dose values to the tiles. The flash dose is the particle beam dwell time, which is the length of time that the particle beam stays on and over a flash location to expose the substrate at that location. The flash dose data is then passed the data to a beam blanker driver 140 of a column drive electronics 132 such as an electron column beam drive electronics, which include for example, digital to analog converters and amplifiers, to operate an electron beam column to modulate the electron beam to flash the beam in the selected order of flashes while moving a substrate upon which the electron beam is incident to write the pattern onto the substrate. Modulation is done by blanking the electron beam of the column using electronics that deflect the particle beam to allow it either to reach, or not reach, the substrate 150.

A flash converter 130 also receives the tiling data from the buffer 120 and operates on the tile data to assign to each tile flash data comprising a flash location, shape and size. The flash converter 130 includes flash formatting program code, flash shape determining program logic, and lookup tables stored in static random access memory (SRAM). The flash converter 130 is part of the hardware and software of the processor 52. Flash converter 130 outputs flash shape data in accordance with a clock (timing) signal from clock 144, which in one version, has a clock signal frequency of 800 MHz.

The column drive electronics 132 prepare the flash data and send control instructions to control the particle beam column 54. In one version, the column drive electronics 132 include a flash shaper driver 134 and beam blanker driver 140, which both contain digital-to-analog converters and analog amplifiers. The flash shaper driver 134 receives the flash data from the flash converter 130 also receives a clock signal from the clock 144. The flash shaper driver 134 controls the particle beam column 54 to shape the particle beam for writing the flashes. The beam blanker driver 140 receives corresponding dose values from the flash dose assignor 124. In one embodiment, the flash converter 130 and flash dose assignor 124 provide a flash data to the flash shaper driver 134 and beam blanker driver 140, for example, approximately every 5 ns or 2.5 ns, corresponding to a 200 MHz or 400 MHz flashing rate. The flash shaper driver 134 and beam blanker driver 140 convert each flash data to voltage values, and provides the voltage values to control particle beam column 54 to write the specified flash field in a proper location on the substrate 150.

A position adjuster 148 controls various deflectors in the particle beam column 54 to deflect the particle beam to the desired positions and also controls the position of a stage 152 upon which the substrate 150 rests, to write the blanked particle beam on the substrate 150 via raster microvector scanning. The stage 152 can move the substrate 150 in any X-Y direction within a plane perpendicular to the direction of the particle beam. The position adjuster circuit 148 compensates for the horizontal movement of substrate 150 on the stage 152 by deflecting the direction of the incident particle beam using an electric field so that particle beam column 54 writes a flash field in a proper location on the substrate.

The particle beam column 54 writes the flash fields on the substrate 150 by deflecting the particle beam to particular flash locations by microvectoring while the beam traverses along a generally periodic trajectory. The generally periodic trajectory can be unidirectional, with a scan of a grid beginning at, for example, a lower left corner of the grid defined on a portion of the substrate and proceeding to the top left corner of the grid, then returning to the bottom of the next leftmost column with the beam blanked, and continuing to scan the next leftmost column in the same direction as the first, i.e. from bottom to top. Scanning continues in the same manner until the entire grid to be patterned is covered. The periodic scan can also be bi-directional in which a scan of a grid begins at the lower left corner of the grid defined on a portion of the substrate 150 and proceeds to the top left corner of the grid, and continues to scan the next leftmost column in the opposite direction to the first, i.e. from top to bottom. Scanning continues in the up-then-down order until the entire grid to be patterned is scanned.

Figure 6:
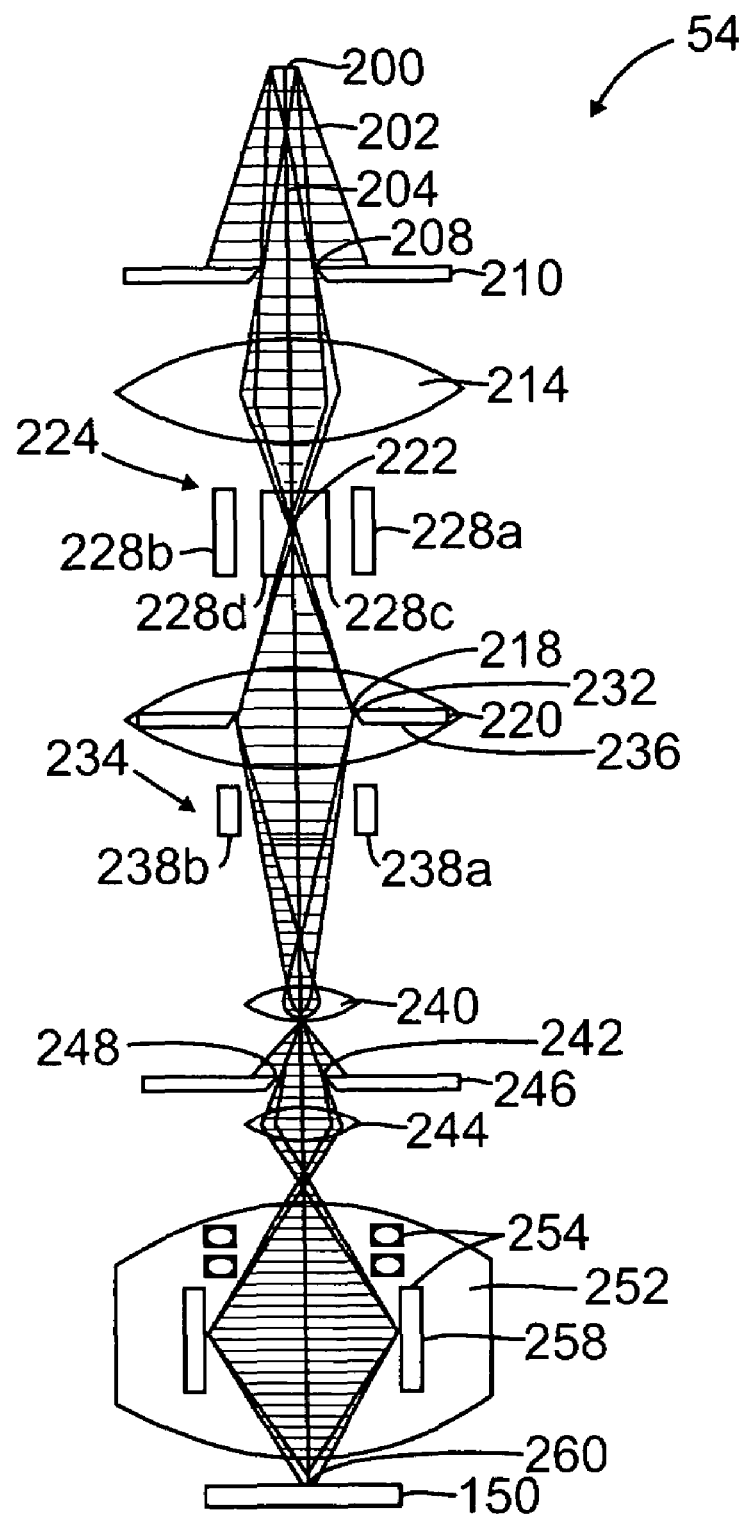
FIG. 6 is a schematic diagram of an exemplary particle beam column that is an electron beam column.

An exemplary version of a particle beam column 54 for generating, shaping, and raster microvector scanning an electron beam across a substrate 150 is shown in FIG. 6. The column 54, which in this example is an electron beam column comprises an electron source 200 which directs an electron beam 202 along an axis 204 toward the substrate 150. The electron source 200 can be a thermal field emission (TFE) electron source, for example, a TFE source that provides a current per unit solid angle, dI/dΩ, otherwise known as angular intensity, of at least 1 mA/steradian. The electron source 200 outputs the electron beam 202 from approximately 420 mm above the surface of the substrate 150. While a thermal field emission source is described it should be noted that other electron sources are also available, for example, lanthanum hexaboride.

The electron beam 202 is shaped into a variable rectangular spot by first passing the beam through a square first upper aperture 208 formed in upper aperture plate 210. Condenser lens 214 which may be an electromagnetic lens focuses an image of upper aperture 208 in the plane of square lower aperture 218 formed in the lower aperture plate 220. The upper aperture plate 210 may have the same or a different configuration than the exemplary upper aperture plate 86 (FIG. 3A) and the lower aperture plate may also have the same or a different configuration than the lower aperture plate 88 (FIG. 3B). The condenser lens 214 also focuses the image 222 of source 200 at a point along the axis 204 and in the center of the first deflector 224. The focal length of lens 214 is determined primarily to focus the aperture image 232 in the plane of lower aperture 228.

The first deflector 224 comprises four electrostatic plates, with two plates 228a,b perpendicular to the plane of the paper (as shown), and two additional plates 228c,d parallel to the plane as shown by the dotted lines. The focused image 222 of the electron source 200 should be at the virtual center of the deflector 224 provided by electrostatic plates 228a-d. Each pair of plates 228a,b and 228c,d serve to deflect the electron beam 202 laterally along two orthogonal directions. The deflector 224 deflects the focused image 232 of the first square upper aperture 208 with respect to second square lower aperture 228 to shape the electron beam to form the desired flash shape.

The condenser lens 236 is a magnetic lens within which the second aperture 218 of the lower aperture plate 220 is disposed. Condenser lens 236 images the source image 222 into the entrance pupil of the first demagnification lens 240.

When two voltage differentials are applied between the electrostatic plate pairs 228a,b and 228c,d, respectively, the image 232 of the first aperture is deflected with respect to the second lower aperture 228, however, the source image 222 is not deflected and remains stationary because it is at the center of deflection. Consequently, irrespective of the deflection of aperture image 232 in the X or Y direction, focused source image 222 remains stationary, and the image of source image 222 projected by condenser lens 236 into the entrance pupil of first demagnification lens 240 will remain constant in position.

The composite image, which is identical with the second lower aperture 228, is demagnified in two steps through first demagnification lens 240 and second demagnification lens 244. Simultaneously, first demagnification lens 240 simultaneously creates a magnified image of the source in the plane of circular hole plate 246. This image of the source is, of course, dependent on the position of source image 222. Since source image 222 remains stationary irrespective of the deflection in forming the composite aperture image, focused image 248 of the source remains centered about the axis 204 at circular hole plate 246. Thus, substantially uniform current density is provided by circular hole plate 246 which admits only the central or axial portion of the Gaussian source being traced and minimizes aberrations generated in the final lens.

Projection lens 252 generates the electron beam spot 260 by projecting the image of the aperture 208 in the upper aperture plate 210 which is then demagnified in two steps by the demagnification lenses 240 and 244 to form the beam spot on the target substrate 150. While the image of aperture 208 is being thus demagnified, the first demagnification lens 240 simultaneously creates a magnified image of the electron beam source 200 in the plane of circular hole 242 of the circular hole plate 246 centered about the electron beam column axis. The second demagnification lens 244 images the circular hole 242 at the center 254 of the projection lens 252 and defines the semi-angle of convergence. Thus, uniform beam current density is provided since circular hole 242 admits only the central or axial portion of the source beam trace which minimizes aberrations. For a given round aperture size, the second demagnification lens determines the final beam convergence angle and consequently the required brightness. The final or projection lens provides the required working distance deflection yoke 258 in order that the beam may be deflected over the target field to be exposed. During the writing of patterns by an electron beam, the intensity of the beam spot 60 is modulated by electrostatic deflectors 228 and 238.

In addition, since the image of the source projected upon the entrance pupil of demagnification lens 240, is centered about the axis irrespective of the deflection, only the central portions of the lenses in the demagnification system and of the projection lens will be primarily utilized. Thus, degradation of beam spot edge resolution which would result if the source image projected upon demagnification and projection lenses were off center is avoided. It should be noted that this latter effect is significant in systems which do not utilize the circular hole 242.

Figure 7A:
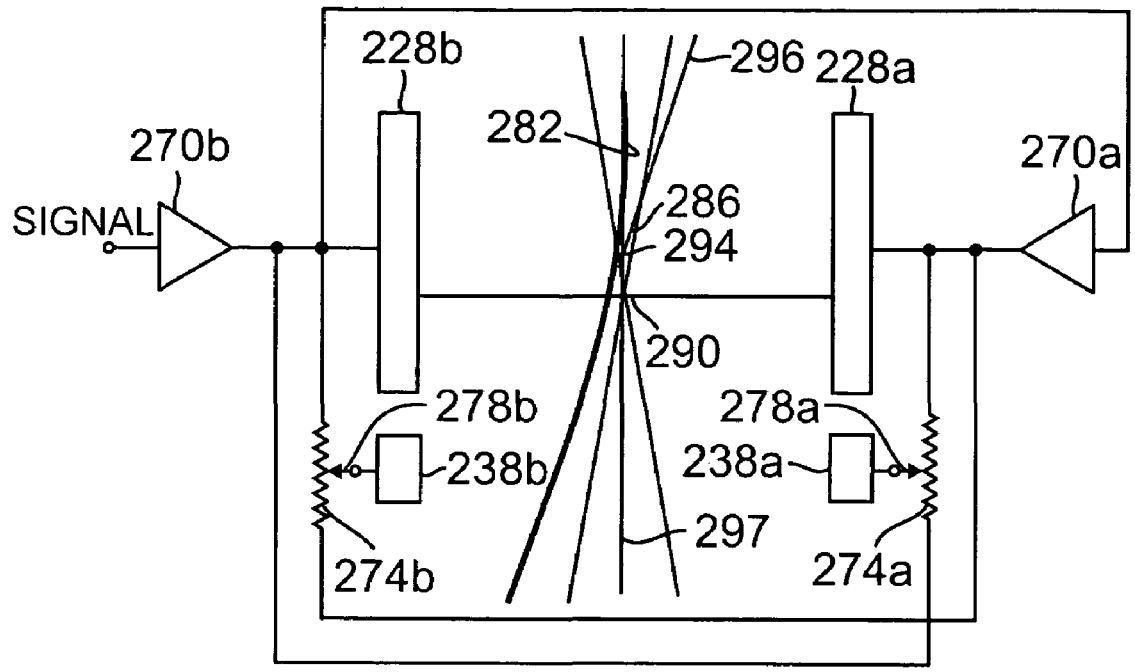
FIGS. 7A and 7B show operation of the electrostatic plates of the deflectors of the electron beam column of FIG. 6 as they deflect the electron beam across the lower aperture to shape the beam.
Figure 7B:
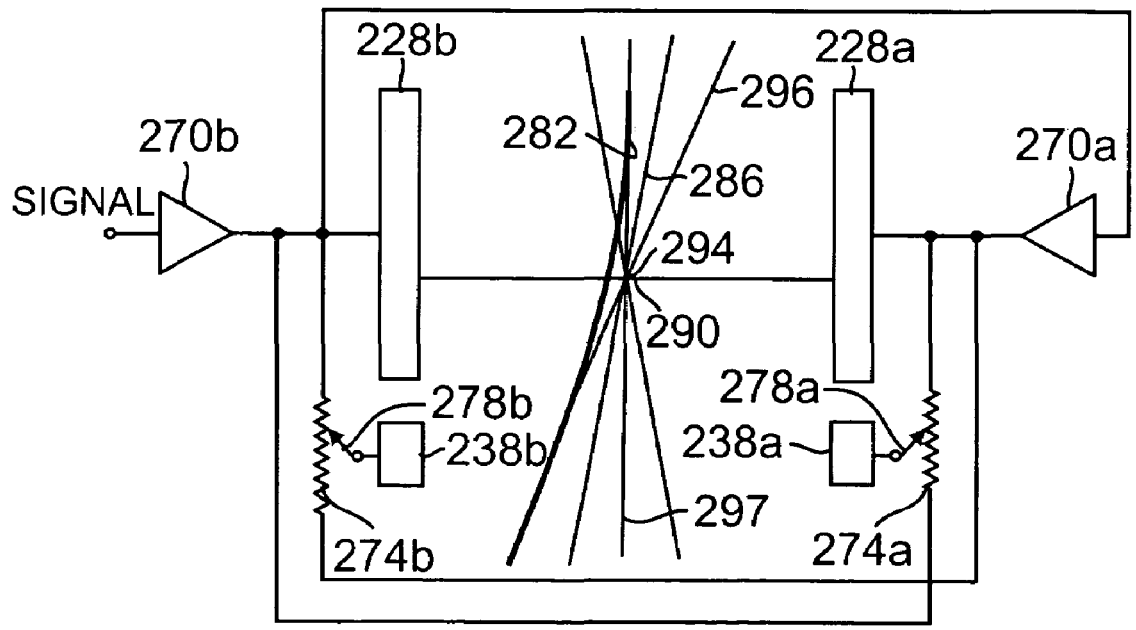

FIGS. 7A and 7B show operation of the first deflector 224 in which a voltage differential is applied between a pair of electrostatic plates 228a,b to provide a push-pull circuit in which the voltage level of plate 228a swings negative relative to the voltage applied to plate 228b and vice versa. Operation of the other plates 228c,d of the first deflector 224 and operation of the plates 238a-d of the second deflector 234 is substantially the same. Initially, the center of deflection is adjusted to coincide with the focused source image. Referring to FIG. 7A, the voltage differential between plates 228a,b is provided by the conventional push-pull circuit through which deflection is achieved by applying a signal to amplifier 270a, the output of which is applied to plate 228a and to amplifier 270b which feeds plate 228b. The voltage level and relative polarity of the signal applied to the two plates 228a,b determine the extent of deflection of the electron beam 202.

The second deflector 234 comprises the plates 238a,b which are each connected to the outputs of amplifiers 228a and 228b respectively through the variable resistors 274a,b. Initially, as shown in FIG. 7A, a differential voltage is applied between the first and second plates 228a,b of the first deflector 224. Since the contacts 278a,b respectively between plates 238a,b and balanced resistors 274a,b are centered with respect to such resistors, plates 278a,b will be at the identical voltage levels which are half-way between the voltage levels of plates 228a,b. The deflection of the path of the first aperture image diagrammatically represented by line 282 will be deflected as shown. Also, as the beam trace 286 of the source image indicates, the source image will be focused at point 290. The virtual center of deflection 294 of the apparatus is determined by the intercept of the extension 296 of the beam path as deflected and axis 297 which was the original path of beam 282 before deflection.

To move the center of deflection to coincide with the focused beam at 290, the apparatus is adjusted as indicated in FIG. 7B. Since the center of deflection 294 produced by voltage drop between primary plates 228a,b is above focused image 290 of the source, the center of deflection 294 is moved down by applying a potential difference between auxiliary plates 238a,b in the same sense as the potential difference between plates 228a,b, i.e., if plate 228a has a positive voltage with respect to plate 228b, then plate 238b is made positive with respect to plate 238a. This is accomplished by moving variable resistor contact 278b as indicated in FIG. 7B so that the portion of variable resistor 274b between plates 238b and 228b is reduced to move the voltage level of plate 238b toward that of plate 228b. Similarly, variable resistor contact 278a is moved to the position indicated to reduce the portion of variable resistor 274a between plate 238a and plate 228a whereby voltage level on plate 238a approaches that of plate 228a. This shifts the path 282 of the aperture image as shown whereby extension 296 crosses axis 297 as shown to produce a virtual center of deflection 294 in coincidence with focus source image 290.

Conversely, if it is desired to move the center of deflection 294 upward, the reverse actions are performed with the variable resistor contacts 278a and 278b. As a result, a voltage drop is produced between plates 238a and 238b which is in the opposite sense to the voltage drop between the plates 234a and 234b. This has the effect of bucking or opposing the deflection action of the plates 234a,b and thereby moving the center of deflection upward.

The voltage drop which may be applied between plates 238a and 238b may be in the order of about ten percent of the voltage drop across the plates 234a and 234b, e.g., when the voltage swing between the plates 234a,b is in the order of about twenty volts, the voltage swing between the plates 238a,b would be in the order of about two volts.

Furthermore, while the instant description is toward moving the center of deflection to deflect the aperture image in one lateral direction, similar deflector plates 234c,d and 238c,d (as shown in FIG. 6) can be used in connection to deflect the beam in the other lateral direction. Also, although electrostatic deflection apparatus has been disclosed for the preferred embodiment as the means for deflecting the image of the first aperture and for moving the center of deflection, it will be clear that other deflection apparatus such as magnetic deflection apparatus may be used for the same purpose.

EXAMPLES

The following examples provide illustrative tiling algorithms that may be used with the present invention. While exemplary algorithms are provided, it should be understood that the invention should not be limited to these algorithms, and other algorithms as would be apparent to those of ordinary skill in the art can also be used; thus, the scope of the present invention should not be limited to these examples.

In these examples, the restricted polygon shapes segmented only into rectangles. Also, in Example 4 the following assumptions were used (i) the minimum flash length (resp., width) is $\mu$, approximately 45 nm; (ii) the maximum flash length (resp. width) is $\phi\lambda$, (iii) the maximum flash area is about $2\lambda$ to $2.25\lambda$; (iv) $\lambda$ is 128 nm at 200 MHz and 96 nm at 400 MHz, and (v) $\phi$ is a parameter which is set at 3/2. Also two phase-sensitive offsets were used, the smaller being $\mu$ and its complement being $\nu=(\lambda-\mu)$. The four printing phases correspond to four overlapped printing passes. The tiles chosen for each of the phases are different from one another to average out systematic errors in flash shape, size, or position. For example, if four first tiles having a first set of shapes are used in phase I, four second tiles having different shapes or the same shapes offset from one another can be used in phase II. This allows the boundaries of the second different tile shapes to cross over the boundaries of the tiles so that the beam exposure areas of each phase are not aligned with one another.

Example 1

A Simple Tiling Algorithm

A simple tiling algorithm which creates dissects a restricted polygon shape into rectangles is a direct product algorithm which can be expressed as follows:

1. Find the maximum flash widths up to $\lambda$ that integrally fit into the rectangle. Because we operate over an integral domain, we generally should employ flashes of two adjacent widths. We should determine integers i, j, and k such that $W=k*(i)+j*(i-1)$, where W is the rectangle width, k the number of occurrences of width (i), and j the number of occurrences of width (i-1).
2. Repeat the determination for the rectangle height, H.
3. The tiling is given by the direct product of determinations 1 and 2.

Figure 8:
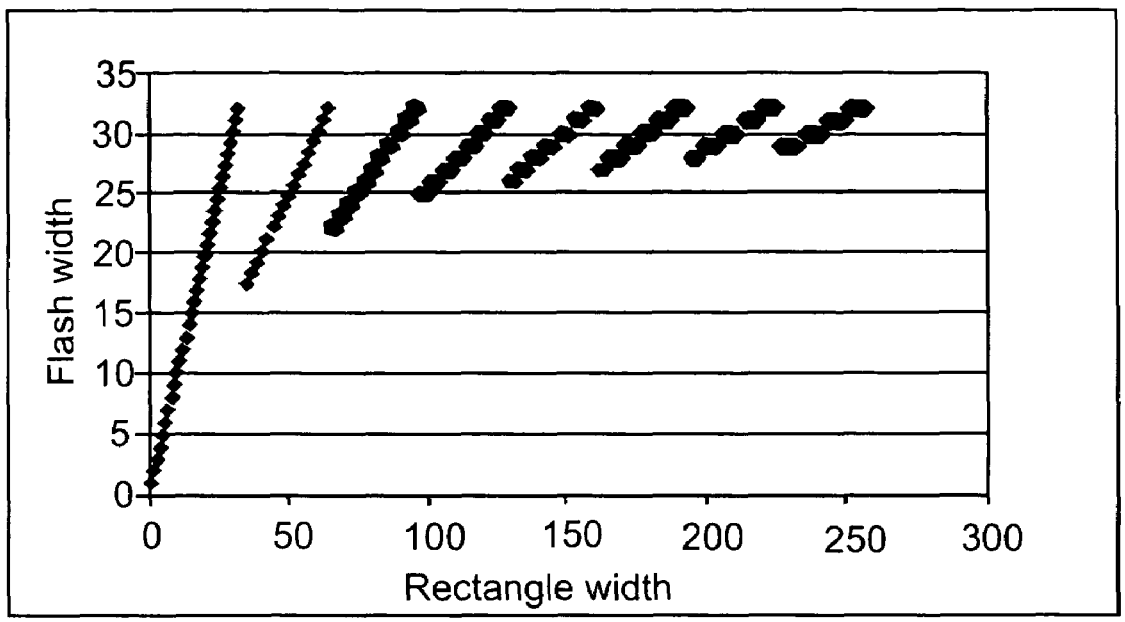
FIG. 8 is the expected flash width as a function of rectangle width or $\lambda=32$, for the simple direct product algorithm.

It is immediately evident that this tiling algorithm is suboptimal. The writing strategy permits flashes to have an area up to $\lambda^2$. For features on the order of a few $\lambda$ in width or height, this algorithm gives an average flash area of roughly $(\frac{3}{4}\lambda)*\lambda$, or even $(\frac{3}{4}\lambda)^2$ in the case that both width and height are similarly small. FIG. 8 is a graph showing the expected flash width as a function of rectangle width for $\lambda=32$.

Example 2

Area Constraint and Inseparability

In this tiling algorithm, the average flash area is maximized while maintaining linear and area constraints but without exploiting interior or external flags. This reduces the number of flashes used for each polygon compared to the algorithm provided above. One possible algorithm is as follows:

1. Find the maximum flash widths up to $\lambda$ from the direct product algorithm. This is the first tentative tiling.
2. Find the maximum flash widths up to $3/2\lambda$ that fit integrally into the rectangle. Because we operate over an integral domain, we generally must employ flashes of two adjacent widths. We must determine integers i, j, and k such that $W=k*(i)+j*(i-1)$, where W is the rectangle width, k the number of occurrences of width (i), and j the number of occurrences of width (i-1).
3. Repeat the determination for the rectangle height, H, but constraining the maximum flash height such that $W*H \leq \lambda^2$.
4. The second tentative tiling is given by the direct product of determinations (2) and (3).
5. Repeat operations (2) to (4), after first interchanging the axes, to give the third tentative tiling.
6. From the three tentative tilings, choose the one with the fewest flashes.

Figure 9:
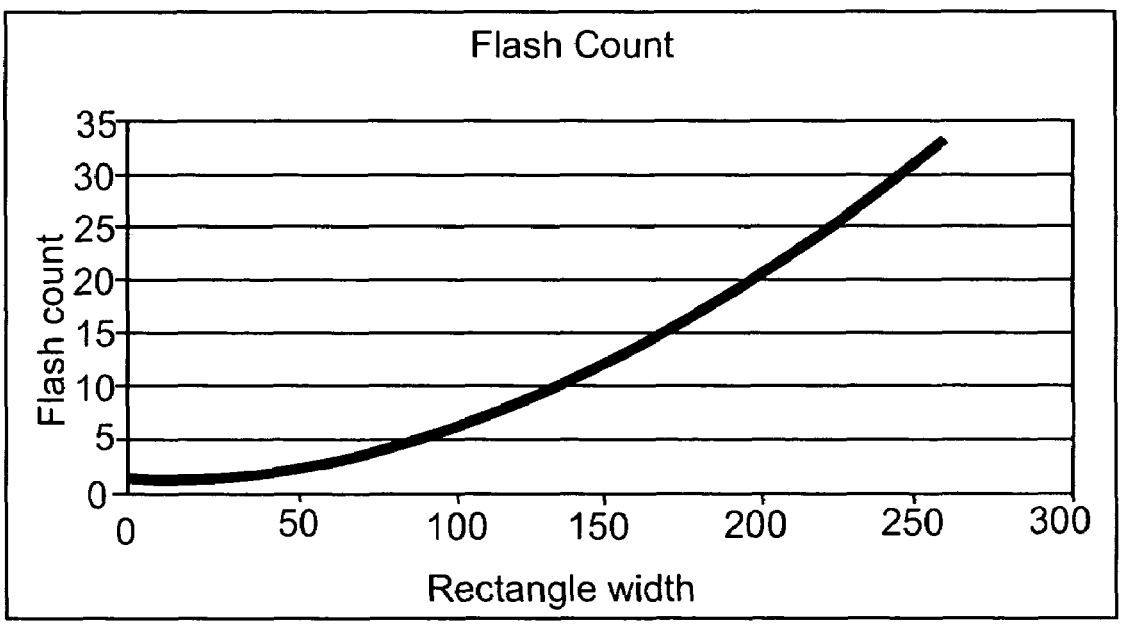
FIG. 9 is a graph showing the expected flash count for all rectangles of sizes X=1-256 by Y=1-X, with $\lambda=32$.
Figure 10:
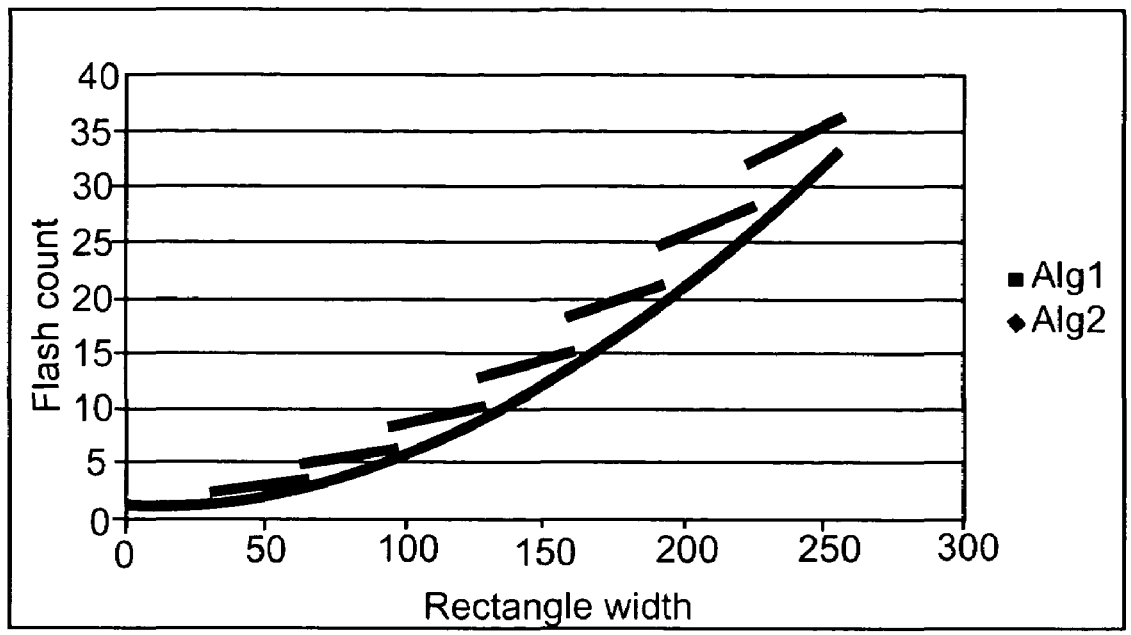
FIG. 10 is a graph showing the expected flash counts from the two algorithms of examples 1 and 2 which are plotted together.

This algorithm shows that coupling the decisions in the two axes leads to reduced flash count. FIG. 9 shows the expected flash count for all rectangles of sizes X=1-256 by Y=1-X, with $\lambda=32$; and FIG. 10 is a graph showing the expected flash counts from the two algorithms of examples 1 and 2 which are plotted together.

Example 3

Fat Flashes

Figure 11:
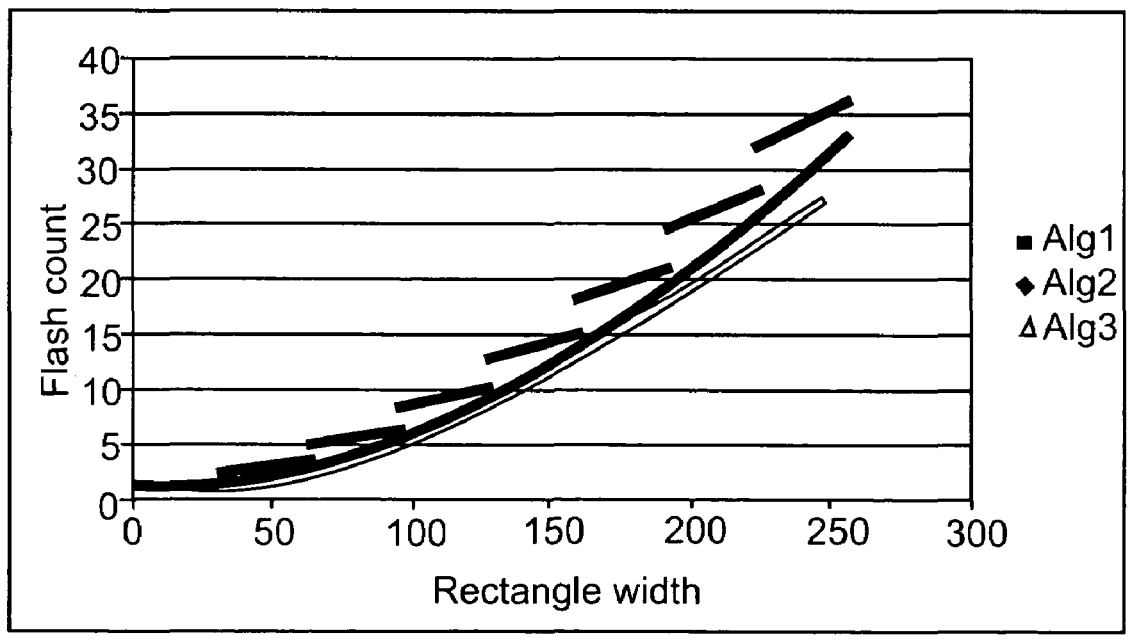
FIG. 11 is a graph showing a comparative plot for the expected flash counts under the same conditions as FIG. 10.

The tiling algorithm can be additionally improved if one exercises the option of filling rectangle interiors with flashes up to $3/2\lambda$ on a side. One possible algorithm proceeds thus:

1. Execute the previous algorithm. This sets the tiling of the rectangle perimeter. If there are fewer than 4 flashes in either axis, stop. Otherwise proceed.
2. Replace the interior (original rectangle minus perimeter flashes) with a new rectangle.
3. Execute the direct product algorithm using $3/2\lambda$ in place of $\lambda$. In the case that step 1 gives fewer than 4 flashes in either axis, it is hard to imagine how to improve the situation by optimizing the interior. FIG. 11 is a graph showing a comparative plot for the expected flash counts under the previous conditions.

However, the fat flash algorithm can be further simplified. In the case that a rectangle is larger than $3\lambda \times 3\lambda$, we proceed as follows:

1. Partition the rectangle into five rectangles, four on the perimeter, each of width $\lambda$, and one interior.
2. Tile each perimeter rectangle with the (degenerate) direct product algorithm.
3. For the interior rectangle, execute the direct product algorithm using $3/2\lambda$ in place of $\lambda$.

Example 4

Edge Tags and Symmetry

There are three edge types: external, internal, and ambiguous. Taking the ambiguous edges as equivalent to the external edges, we have $2^4$ combinations of edge types to consider. However, symmetry allows us to reduce this considerably to six cases. Numbering the edges counter-clockwise from the left edge, these six cases are:

| 1 | E | E | E | E | E | I |
| 2 | E | E | E | I | I | I |
| 3 | E | E | I | E | I | I |
| 4 | E | I | I | I | I | I |

We use the phase-sensitive offsets indicated in the introduction. The tilings depend on the type of rectangle at hand, narrow or wide. We distinguish between the two by the minimum dimension being less than or greater than $\lambda+\mu$. We proceed from large to small.

Case EEEE

Figure 12:
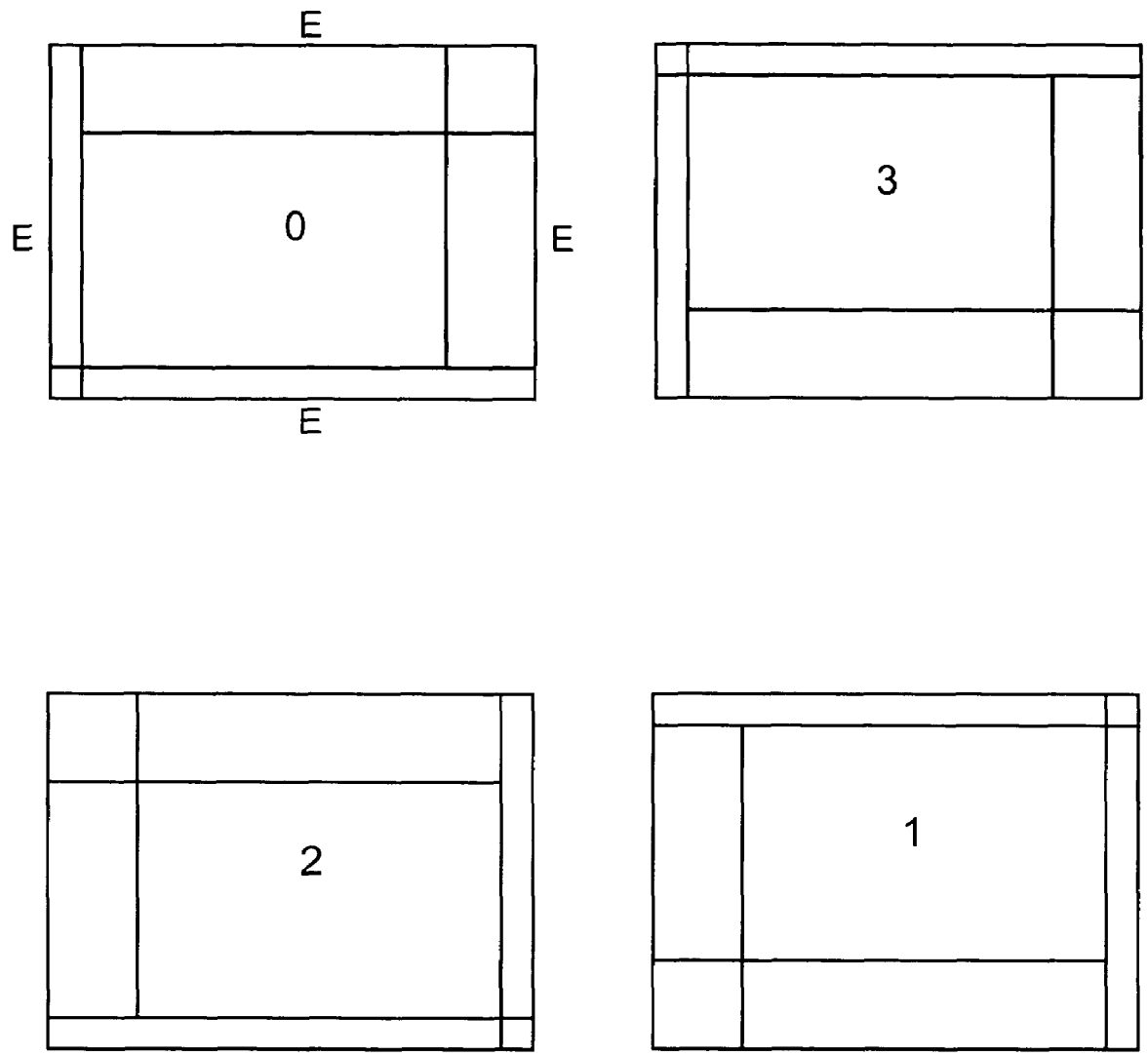
FIG. 12 is a diagram showing different ways to fracture a large EEEE rectangle to form interior and external edge tiles that can be used in different phases.

The phase fracturing of a large EEEE rectangle to tile all four edges to vote the flashes over phases is shown in FIG. 12. In this example, the algorithm is:

1. Phase 0:
   a. Partition the rectangle into four rectangles: a square of size $\mu \times \mu$ in the lower left corner, a right-adjacent rectangle of width $\mu$, a top-adjacent rectangle of width $\mu$, and the remainder R. The width is the narrow dimension of a rectangle, regardless of orientation.
   b. Partition the remainder R into four rectangles: an upper right corner of width $\nu$, a left-adjacent rectangle of width $\nu$, a bottom-adjacent rectangle of width $\nu$, and a strictly internal remainder.
   c. Tile each perimeter rectangle with the (degenerate) direct product algorithm.
   d. For the remaining internal rectangle, execute the direct product algorithm using $\phi\lambda$ in place of $\lambda$.
2. Phase 1:
   a. Partition the rectangle into four rectangles: a square of size $\mu \times \mu$ in the upper right corner, a left-adjacent rectangle of width $\mu$, a bottom-adjacent rectangle of width $\mu$, and the remainder R.
   b. Partition the remainder R into four rectangles: a lower left corner of width $\nu$, a right-adjacent rectangle of width $\nu$, a top-adjacent rectangle of width $\nu$, and a strictly internal remainder.
   c. Tile each perimeter rectangle with the (degenerate) direct product algorithm.
   d. For the remaining internal rectangle, execute the direct product algorithm using $\phi\lambda$ in place of $\lambda$.
3. Phase 2:
   a. Partition the rectangle into four rectangles: a square of size $\mu \times \mu$ in the lower right corner, a left-adjacent rectangle of width $\mu$, a top-adjacent rectangle of width $\mu$, and the remainder R.
   b. Partition the remainder R into four rectangles: an upper left corner of width $\nu$, a right-adjacent rectangle of width $\nu$, a bottom-adjacent rectangle of width $\nu$, and a strictly internal remainder.
   c. Tile each perimeter rectangle with the (degenerate) direct product algorithm.
   d. For the remaining internal rectangle, execute the direct product algorithm using $\phi\lambda$ in place of $\lambda$.
4. Phase 3:
   a. Partition the rectangle into four rectangles: a square of size $\mu \times \mu$ in the upper left corner, a right-adjacent rectangle of width $\mu$, a bottom-adjacent rectangle of width $\mu$, and the remainder R.
   b. Partition the remainder R into four rectangles: a lower right corner of width $\nu$, a left-adjacent rectangle of width $\nu$, a top-adjacent rectangle of width $\nu$, and a strictly internal remainder.
   c. Tile each perimeter rectangle with the (degenerate) direct product algorithm.
   d. For the remaining internal rectangle, execute the direct product algorithm using $\phi\lambda$ in place of $\lambda$.

Case EEEI

Figure 13:
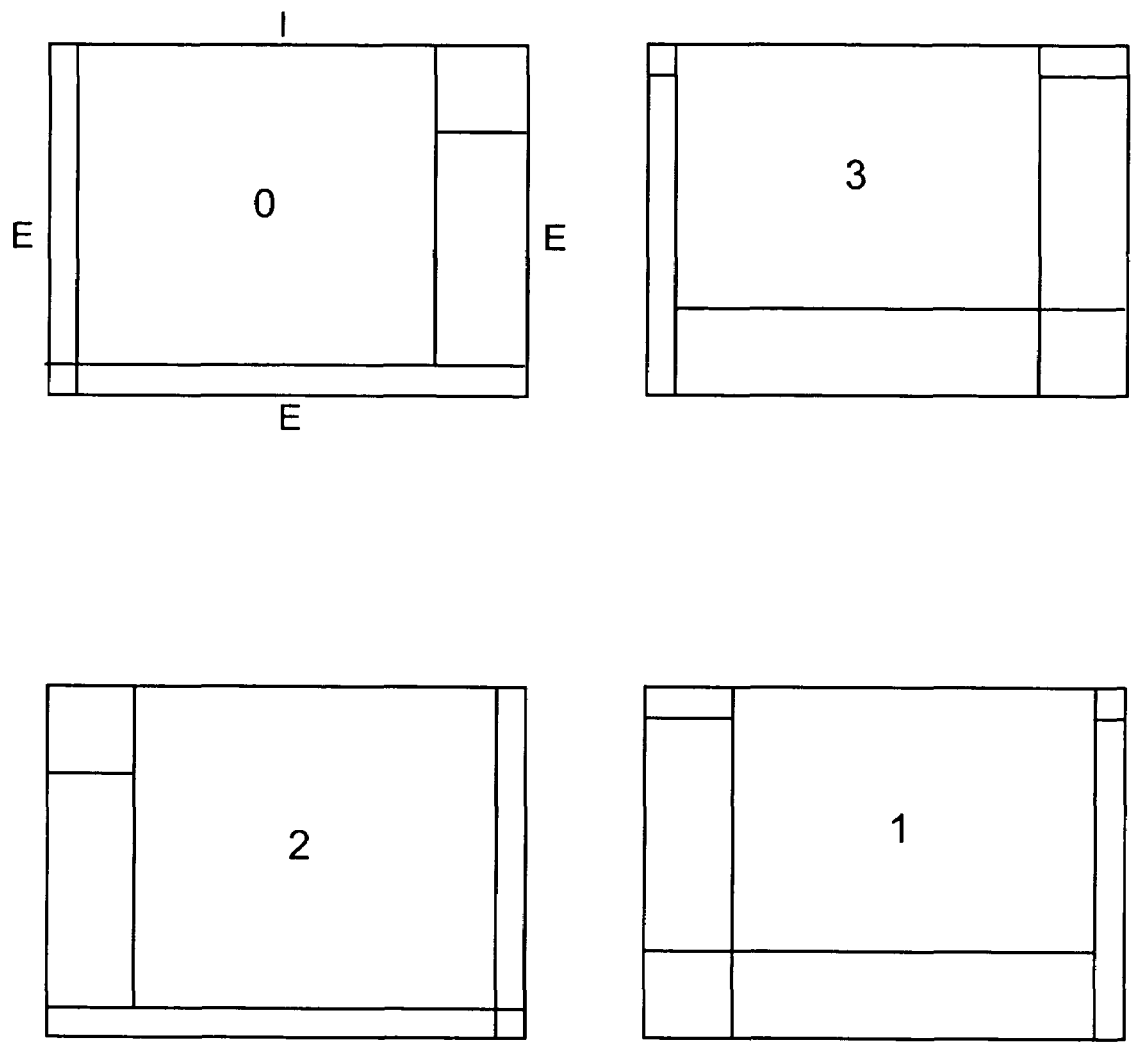
FIG. 13 is a diagram showing different ways to fracture a large EEEI rectangle.

In this example, as shown in FIG. 13, there is one edge which does not need phase-sensitive tiling. However, it is bounded by edges which do, so the last flashes along the interior edge are forced by the adjacent external edges. Conceptually, one could follow the EEEE algorithm and then patch up the result by merging select sub-figures adjacent and next-adjacent to the internal edge. However, this can result in an inefficient algorithm causing more internal edges (vide infra) so it is better to take an approach that avoids making unnecessary cuts. In this example, the algorithm is as follows:

1. Phase 0:
   a. Partition the rectangle into four rectangles: a square of size $\lambda \times \lambda$ in the lower left corner, a right-adjacent rectangle of width $\lambda$, a top-adjacent rectangle of width $\lambda$, and the remainder R.
   b. Partition the remainder R into three rectangles: a square of width $\nu$ in the upper right corner, a bottom-adjacent rectangle of width $\nu$, and a strictly internal remainder.
   c. Tile each perimeter rectangle with the (degenerate) direct product algorithm.
   d. For the remaining internal rectangle, execute the direct product algorithm using $\phi\lambda$ in place of $\lambda$.
2. Phase 1:
   a. Partition the rectangle into three rectangles: a square of size $\mu \times \mu$ in the upper right corner, a bottom-adjacent rectangle of width $\mu$, and the remainder R.
   b. Partition the remainder R into four rectangles: a square of width $\nu$ in the lower left corner, a right-adjacent rectangle of width $\nu$, a top-adjacent rectangle of width $\nu$, and a strictly internal remainder.
   c. Partition the leftmost rectangle into an upper rectangle of width $\mu$ and a remainder.
   d. Tile each perimeter rectangle with the (degenerate) direct product algorithm.
   e. For the remaining internal rectangle, execute the direct product algorithm using $\phi\lambda$ in place of $\lambda$.
3. Phase 2:
   a. Partition the rectangle into four rectangles: a square of size $\mu \times \mu$ in the lower right corner, a left-adjacent rectangle of width $\mu$, a top-adjacent rectangle of width $\mu$, and the remainder R.
   b. Partition the remainder R into three rectangles: a square of width $\nu$ in the upper left corner, a bottom-adjacent rectangle of width $\nu$, and a strictly internal remainder.
   c. Tile each perimeter rectangle with the (degenerate) direct product algorithm.
   d. For the remaining internal rectangle, execute the direct product algorithm using $\phi\lambda$ in place of $\lambda$.
4. Phase 3:
   a. Partition the rectangle into three rectangles: a square of size $\mu \times \mu$ in the upper left corner, a bottom-adjacent rectangle of width $\mu$, and the remainder R.
   b. Partition the remainder R into four rectangles: a square of width $\nu$ in the lower right corner, a left-adjacent rectangle of width $\nu$, a top-adjacent rectangle of width $\nu$, and a strictly internal remainder.
   c. Partition the rightmost rectangle into an upper rectangle of width $\mu$ and a remainder.
   d. Tile each perimeter rectangle with the (degenerate) direct product algorithm.

e. For the remaining internal rectangle, execute the direct product algorithm using $\phi\lambda$ in place of $\lambda$.

Case EEII

Figure 14:
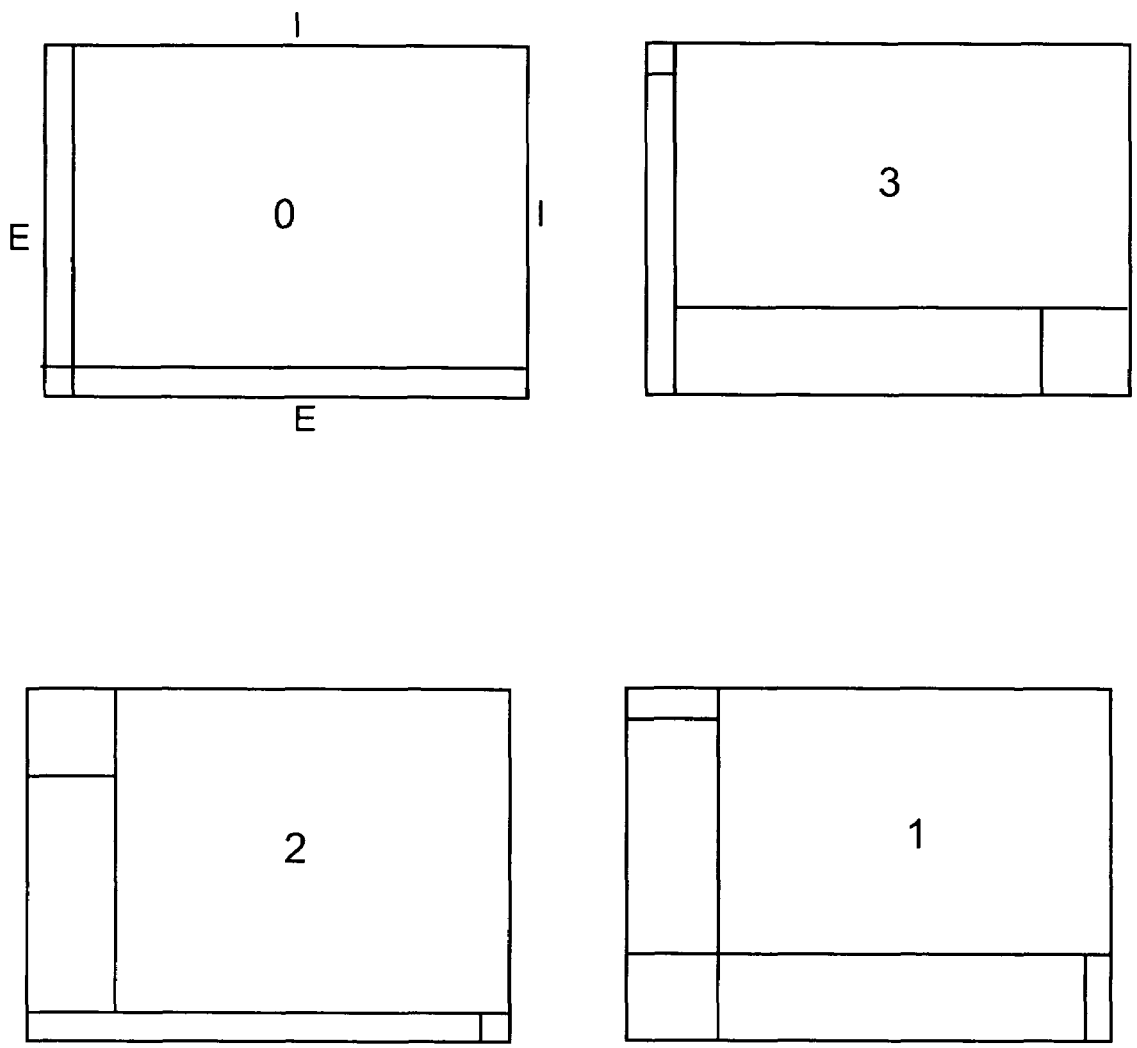
FIG. 14 is a diagram showing different ways to fracture a large EEII rectangle.

Analogously to the above, the algorithm in this case simply elaborates the sequence of partitions which need to be executed, FIG. 14 shows this example.

1. Phase 0:
   a. Partition the rectangle into four rectangles: a square of size $\mu\times\mu$ in the lower left corner, a right-adjacent rectangle of width $\mu$, a top-adjacent rectangle of width $\mu$, and the remainder R.
   b. Tile each perimeter rectangle with the (degenerate) direct product algorithm.
   c. For the remaining internal rectangle, execute the direct product algorithm using $\phi\lambda$ in place of $\lambda$.
2. Phase 1:
   a. Partition the rectangle into four rectangles: a square of width $\nu$ in the lower left corner, a top-adjacent rectangle of width $\nu$, a right-adjacent rectangle of width $\nu$, and a strictly internal remainder.
   b. Partition the leftmost rectangle into an upper rectangle of width $\mu$ and a remainder.
   c. Partition the bottom-most rectangle into a right rectangle of width $\mu$ and a remainder.
   d. Tile each perimeter rectangle with the (degenerate) direct product algorithm.
   e. For the remaining internal rectangle, execute the direct product algorithm using $\phi\lambda$ in place of $\lambda$.
3. Phase 2:
   a. Partition the rectangle into three rectangles: a square of size $\mu\times\mu$ in the lower right corner, a left-adjacent rectangle of width $\mu$, and the remainder R.
   b. Partition the remainder R into three rectangles: a square of width $\nu$ in the upper left corner, a bottom-adjacent rectangle of width $\nu$, and a strictly internal remainder.
   c. Tile each perimeter rectangle with the (degenerate) direct product algorithm.
   d. For the remaining internal rectangle, execute the direct product algorithm using $\phi\lambda$ in place of $\lambda$.
4. Phase 3:
   a. Partition the rectangle into three rectangles: a square of size $\mu\times\mu$ in the upper left corner, a bottom-adjacent rectangle of width $\mu$, and the remainder R.
   b. Partition the remainder R into three rectangles: a square of width $\nu$ in the lower right corner, a left-adjacent rectangle of width $\nu$, and a strictly internal remainder.
   c. Partition the bottom-most rectangle into a right rectangle of width $\mu$, and a remainder.
   d. Tile each perimeter rectangle with the (degenerate) direct product algorithm.
   e. For the remaining internal rectangle, execute the direct product algorithm using $\phi\lambda$ in place of $\lambda$.

Case EIEI

Figure 15:
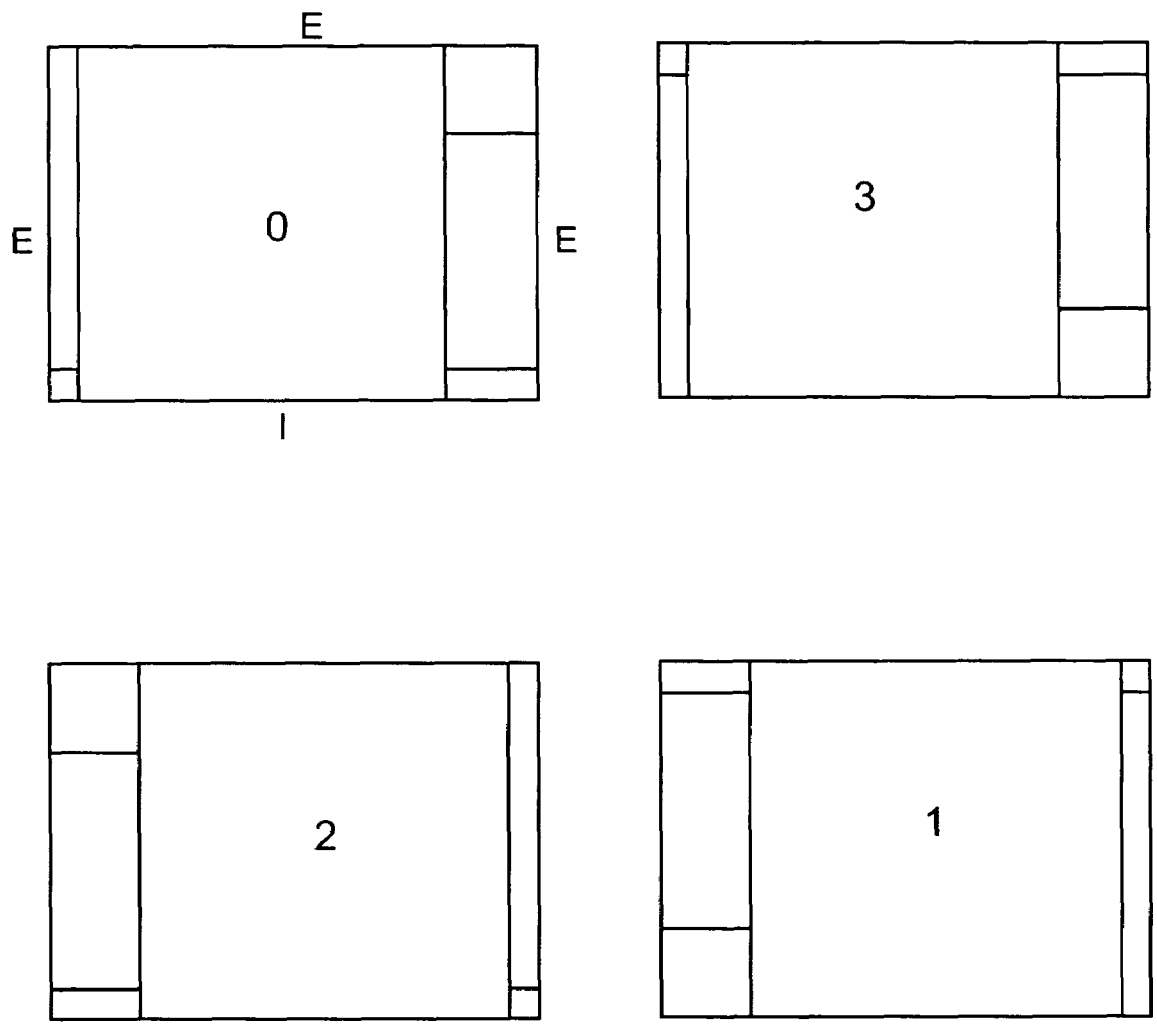
FIG. 15 is a diagram showing different ways to fracture a large EIEI rectangle.

FIG. 15 shows implementation of this algorithm, which is:
1. Phase 0:
   a. Partition the rectangle into three rectangles: a rectangle of width $\mu$ along the left exterior edge, a rectangle of width $\nu$ along the right exterior edge, and a remainder R.
   b. Partition the left rectangle into a lower square of width $\mu$, and a remainder.
   c. Partition the right rectangle into three parts: an upper square of width $\nu$, a lower rectangle of width $\mu$, and a remainder.
   d. Tile each perimeter rectangle with the (degenerate) direct product algorithm.
   e. For the remaining internal rectangle, execute the direct product algorithm using $\phi\lambda$ in place of $\lambda$.
2. Phase 1:
   a. Partition the rectangle into three rectangles: a rectangle of width $\mu$ along the right exterior edge, a rectangle of width $\nu$ along the left exterior edge, and a remainder R.
   b. Partition the right rectangle into an upper square of width $\mu$, and a remainder.
   c. Partition the left rectangle into three parts: a lower square of width $\nu$, an upper rectangle of width $\mu$, and a remainder.
   d. Tile each perimeter rectangle with the (degenerate) direct product algorithm.
   e. For the remaining internal rectangle, execute the direct product algorithm using $\phi\lambda$ in place of $\lambda$.
3. Phase 2:
   a. Partition the rectangle into three rectangles: a rectangle of width $\mu$ along the right exterior edge, a rectangle of width $\nu$ along the left exterior edge, and a remainder R.
   b. Partition the right rectangle into a lower square of width $\mu$, and a remainder.
   c. Partition the left rectangle into three parts: an upper square of width $\nu$, a lower rectangle of width $\mu$, and a remainder.
   d. Tile each perimeter rectangle with the (degenerate) direct product algorithm.
   e. For the remaining internal rectangle, execute the direct product algorithm using $\phi\lambda$ in place of $\lambda$.
4. Phase 3:
   a. Partition the rectangle into three rectangles: a rectangle of width $\mu$ along the left exterior edge, a rectangle of width $\nu$ along the right exterior edge, and a remainder R.
   b. Partition the left rectangle into an upper square of width $\mu$, and a remainder.
   c. Partition the right rectangle into three parts: a lower square of width $\nu$, an upper rectangle of width $\mu$, and a remainder.
   d. Tile each perimeter rectangle with the (degenerate) direct product algorithm.
   e. For the remaining internal rectangle, execute the direct product algorithm using $\phi\lambda$ in place of $\lambda$.

Case EIII

Figure 16:
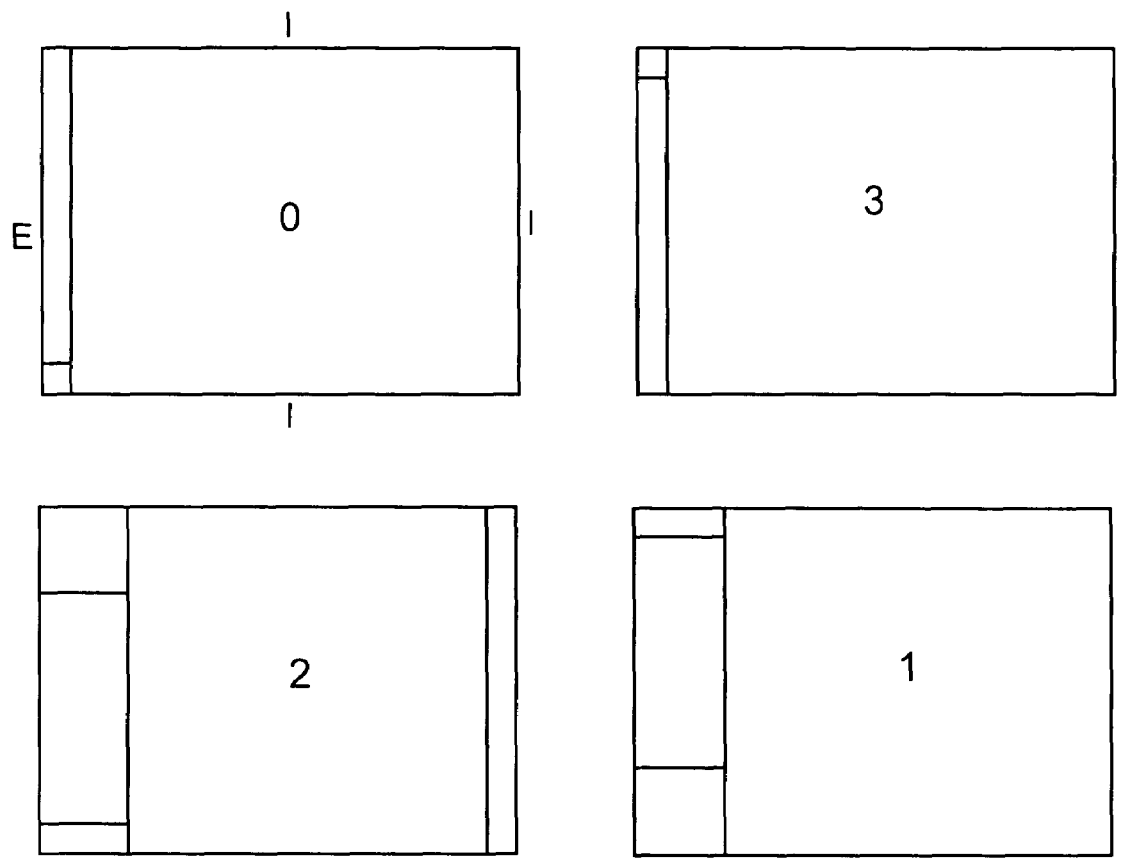
FIG. 16 is a diagram showing different ways to fracture a large EIII rectangle.

FIG. 16 shows this example, the algorithm being:
1. Phase 0:
   a. Partition the rectangle into three parts: a lower left square of width $\mu$, a top-adjacent rectangle, and a remainder.
   b. Tile each perimeter rectangle with the (degenerate) direct product algorithm.
   c. For the remaining internal rectangle, execute the direct product algorithm using $\phi\lambda$ in place of $\lambda$.
2. Phase 1:
   a. Partition the rectangle into three parts: a lower left square of width $\nu$, a top-adjacent rectangle, and a remainder.
   b. Partition the left rectangle into two parts: a top rectangle of width $\mu$, and a remainder.
   c. Tile each perimeter rectangle with the (degenerate) direct product algorithm.
   d. For the remaining internal rectangle, execute the direct product algorithm using $\phi\lambda$ in place of $\lambda$.
3. Phase 2:
   a. Partition the rectangle into three parts: an upper left square of width $\nu$, a bottom-adjacent rectangle, and a remainder.
   b. Partition the left rectangle into two parts: a bottom rectangle of width $\mu$, and a remainder.

c. Tile each perimeter rectangle with the (degenerate) direct product algorithm.
d. For the remaining internal rectangle, execute the direct product algorithm using $\phi\lambda$ in place of $\lambda$.
4. Phase 3:
   a. Partition the rectangle into three parts: an upper left square of width $\mu$, a bottom-adjacent rectangle, and a remainder.
   b. Tile each perimeter rectangle with the (degenerate) direct product algorithm.
   c. For the remaining internal rectangle, execute the direct product algorithm using $\phi\lambda$ in place of $\lambda$.

Cases EEEE, EEEI, EEII, EIEI, EIII: Narrow Rectangles

Figure 17:
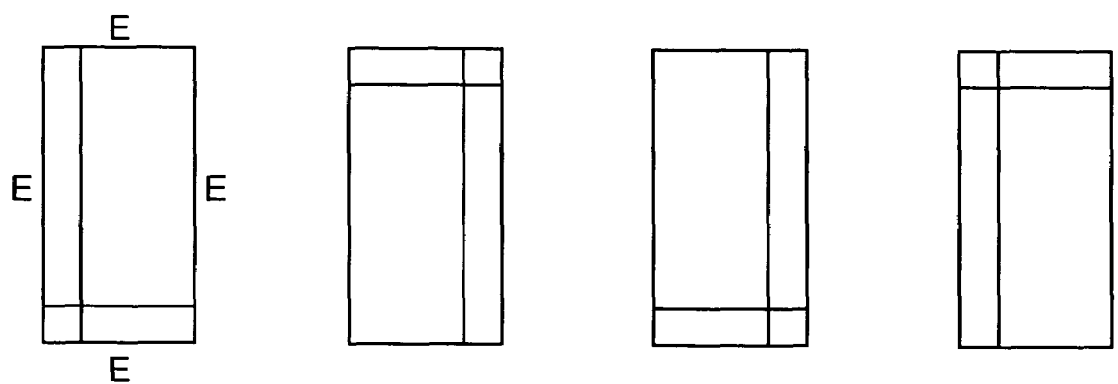
FIG. 17 is a diagram showing different ways to fracture a small EEEE rectangle.

Narrow rectangles cannot be usefully tiled as above. For minimum dimensions between $\lambda$ and $\lambda+\mu$, one obtains slivers in the interior. For minimum dimensions between $\mu$ and $\lambda$, one cannot make the indicated partitions. The following algorithm is the same for all cases. One might save a flash in some phases for cases EEII and EIII, but it does not appear worth the additional complexity. FIG. 17 shows this version, and the algorithm is:
1. Phase 0:
   a. Partition the figure into four parts: a lower left square of size $\mu$, a right-adjacent rectangle, a top-adjacent rectangle, and a remainder.
   b. Partition the rectangles by the direct product algorithm.
2. Phase 1:
   a. Partition the figure into four parts: a upper right square of size $\mu$, a left-adjacent rectangle, a bottom-adjacent rectangle, and a remainder.
   b. Partition the rectangles by the direct product algorithm.
3. Phase 2:
   a. Partition the figure into four parts: a lower right square of size $\mu$, a left-adjacent rectangle, a top-adjacent rectangle, and a remainder.
   b. Partition the rectangles by the direct product algorithm.
4. Phase 3:
   a. Partition the figure into four parts: a upper left square of size $\mu$, a right-adjacent rectangle, a bottom-adjacent rectangle, and a remainder.
   b. Partition the rectangles by the direct product algorithm.

Although the present invention has been described in considerable detail with regard to certain preferred versions thereof, other versions are possible. The present invention could be used with other particle beam apparatuses or other equivalent configurations as would be apparent to one of ordinary skill in the art. Also, the electron beam apparatus 50 may generate a pattern by vector or gaussian beam scanning or other methods of scanning. Thus, the appended claims should not be limited to the description of the preferred versions contained herein.

What is claimed is:

1. A shaped particle beam writing strategy for writing a circuit design pattern with a particle beam onto a substrate, the circuit design pattern comprising a plurality of polygons, and the writing strategy comprising:
   (a) tiling the polygons into a set of tiles comprising interior tiles and external edge tiles;
   (b) assigning a flash area for each tile such that the interior tiles are assigned a first flash area and the external edge tiles are assigned a second flash area that is smaller than the first flash area; and
   (c) arranging the flashes in a selected order to write the circuit design pattern with a particle beam onto a substrate.

2. A writing strategy according to claim 1 wherein the second flash area is less than about ¾ the first flash area.

3. A writing strategy according to claim 1 wherein the second flash area is less than or equal to about $\lambda^2$, where $\lambda$ is a characteristic dimension of the electron beam.

4. A writing strategy according to claim 3 wherein the first flash area is less than or equal to about $2\lambda^2$.

5. A writing strategy according to claim 3 wherein any dimension of the first or second flash area is less than or equal to about $3/2\lambda$.

6. A writing strategy according to claim 3 wherein $\lambda$ is from 50 nm to about 200 nm.

7. A writing strategy according to claim 3 wherein $\lambda$ is about 128 nm.

8. A writing strategy according to claim 1 wherein the shaped particle beam comprises a shaped electron beam.

9. A writing strategy according to claim 1 wherein the selected order of flashes is a raster, vector, or hybrid raster-vector scan.

10. A writing strategy according to claim 1 comprising the initial steps of:
    (1) reading a circuit design pattern comprising a set of geometric primitives composed of arbitrary polygons; and
    (2) fracturing the arbitrary polygons into a plurality of restricted polygons, wherein each restricted polygon is represented by a location coordinate, at least two dimension coordinates, and at least one external edge indicator.

11. A writing strategy for writing a circuit design pattern with an electron beam onto a substrate, the writing strategy comprising:
    (a) reading a circuit design pattern comprising a set of geometric primitives composed of arbitrary polygons;
    (b) fracturing the arbitrary polygons into a plurality of restricted polygons, each restricted polygon being represented by a location coordinate, at least two dimension coordinates, and at least one external edge indicator;
    (c) tiling the restricted polygons into a set of tiles comprising interior tiles and external edge tiles;
    (d) assigning an electron beam flash area to each tile, the electron beam flash comprising a first flash area for an interior tile and a second flash area for an external edge tile, the second flash area being smaller than the first flash area;
    (e) arranging the electron beam flashes in a selected order; and
    (f) moving an electron beam across a substrate and modulating the electron beam to flash the beam in the selected order to write the circuit design pattern onto the substrate.

12. A writing strategy according to claim 11 wherein the second flash area is less than about ¾ the first flash area.

13. A writing strategy according to claim 11 wherein the second flash area is less than or equal to about $\lambda^2$, where $\lambda$ is a characteristic dimension of the electron beam.

14. A writing strategy according to claim 13 wherein the first flash area is less than or equal to about $2\lambda^2$.

15. A writing strategy according to claim 13 wherein any dimension of the first or second flash area is less than or equal to about $3/2\lambda$.

16. A writing strategy according to claim 13 wherein $\lambda$ is from 50 to about 200 nm.

* * * * *